(12) United States Patent
Kawada et al.

(10) Patent No.: US 9,803,161 B2
(45) Date of Patent: Oct. 31, 2017

(54) CLEANING AGENT FOR SEMICONDUCTOR SUBSTRATES AND METHOD FOR PROCESSING SEMICONDUCTOR SUBSTRATE SURFACE

(71) Applicant: WAKO PURE CHEMICAL INDUSTRIES, LTD., Osaka-shi, Osaka (JP)

(72) Inventors: Hiromi Kawada, Kawagoe (JP); Hironori Mizuta, Kawagoe (JP); Tsuneaki Maesawa, Kawagoe (JP)

(73) Assignee: WAKO PURE CHEMICAL INDUSTRIES, LTD., Osaka-shi (JP)

( * ) Notice: Subject to any disclaimer, the term of this patent is extended or adjusted under 35 U.S.C. 154(b) by 457 days.

(21) Appl. No.: 14/397,364

(22) PCT Filed: Apr. 26, 2013

(86) PCT No.: PCT/JP2013/062464
§ 371 (c)(1),
(2) Date: Oct. 27, 2014

(87) PCT Pub. No.: WO2013/162020
PCT Pub. Date: Oct. 31, 2013

(65) Prior Publication Data
US 2015/0140820 A1    May 21, 2015

(30) Foreign Application Priority Data

Apr. 27, 2012   (JP) ................. 2012-103921

(51) Int. Cl.
| | | |
|---|---|---|
| C11D 7/50 | (2006.01) | |
| C11D 11/00 | (2006.01) | |
| C11D 7/36 | (2006.01) | |
| H01L 21/02 | (2006.01) | |
| C11D 7/32 | (2006.01) | |
| H01L 21/768 | (2006.01) | |
| H01L 21/3105 | (2006.01) | |
| H01L 21/321 | (2006.01) | |

(52) U.S. Cl.
CPC ........ *C11D 11/0047* (2013.01); *C11D 7/3218* (2013.01); *C11D 7/36* (2013.01); *H01L 21/0206* (2013.01); *H01L 21/02068* (2013.01); *H01L 21/02074* (2013.01); *H01L 21/31055* (2013.01); *H01L 21/3212* (2013.01); *H01L 21/7684* (2013.01)

(58) Field of Classification Search
CPC ................................................ C11D 11/0047
See application file for complete search history.

(56) References Cited

U.S. PATENT DOCUMENTS

| | | | |
|---|---|---|---|
| 6,143,705 A | 11/2000 | Kakizawa et al. | |
| 6,395,693 B1 | 5/2002 | Wang | |
| 6,410,494 B2 | 6/2002 | Kakizawa et al. | |
| 6,514,921 B1 | 2/2003 | Kakizawa et al. | |
| 2003/0083214 A1 | 5/2003 | Kakizawa et al. | |
| 2006/0154838 A1 | 7/2006 | Hayashida et al. | |
| 2008/0206995 A1* | 8/2008 | Tomiga | C09G 1/02 438/693 |
| 2008/0242091 A1* | 10/2008 | Kato | C09G 1/02 438/693 |
| 2011/0098205 A1 | 4/2011 | Lee | |
| 2012/0000485 A1* | 1/2012 | Mizuta | C11D 7/261 134/3 |
| 2013/0203643 A1* | 8/2013 | Nakanishi | C11D 3/0042 510/175 |

FOREIGN PATENT DOCUMENTS

| | | |
|---|---|---|
| CN | 1376307 A | 10/2002 |
| JP | 10-072594 A | 3/1998 |
| JP | 11-040526 A | 2/1999 |
| JP | 11-40526 A | 2/1999 |
| JP | 2002-299300 A | 10/2002 |
| JP | 2003-510840 A | 3/2003 |
| JP | 2009-239206 A | 10/2009 |
| JP | 2010-258014 A | 11/2010 |

(Continued)

OTHER PUBLICATIONS

International Search Report dated Aug. 6, 2013, issued in corresponding application No. PCT/JP2013/062464.
Office Action dated Feb. 16, 2016, issued in counterpart European Application No. 13 780 549.5 (7 pages).
Extended Search Report dated Apr. 15, 2015, issued in counterpart European Application No. 13780549.5 (7 pages).
Non-Final Office Action dated Nov. 8, 2016, issued in counterpart Japanese Application No. 2014-512722 (3 pages).
Non-Final Office Action dated May 30, 2016, issued in counterpart Chinese Application No. 201380022014.7 (8 pages).
Non-Final Office Action dated Feb. 4, 2017, issued in counterpart Chinese Application No. 201380022014.7 (5 pages).

*Primary Examiner* — Gregory Webb
(74) *Attorney, Agent, or Firm* — Westerman, Hattori, Daniels & Adrian, LLP

(57) ABSTRACT

A cleaning agent is provided for a semiconductor substrate superior in corrosion resistance of a tungsten wiring or a tungsten alloy wiring, and superior in removal property of polishing fines (particle) such as silica or alumina, remaining at surface of the semiconductor substrate, in particular, at surface of a silicon oxide film such as a TEOS film, after a chemical mechanical polishing process; and a method for processing a semiconductor substrate surface. A cleaning agent for a semiconductor substrate is to be used in a post process of a chemical mechanical polishing process of the semiconductor substrate having a tungsten wiring or a tungsten alloy wiring, and a silicon oxide film, comprising (A) a phosphonic acid-based chelating agent, (B) a primary or secondary monoamine having at least one alkyl group or hydroxyalkyl group in a molecule and (C) water, wherein a pH is over 6 and below 7.

7 Claims, No Drawings

(56) References Cited

FOREIGN PATENT DOCUMENTS

| | | |
|---|---|---|
| JP | 2011-159658 A | 8/2011 |
| WO | 01/24242 A1 | 4/2001 |
| WO | 01/71789 A1 | 9/2001 |
| WO | 2004/042811 A1 | 5/2004 |
| WO | 2006/129538 A1 | 12/2006 |

* cited by examiner

CLEANING AGENT FOR SEMICONDUCTOR SUBSTRATES AND METHOD FOR PROCESSING SEMICONDUCTOR SUBSTRATE SURFACE

TECHNICAL FIELD

The present invention relates to a cleaning agent to be used in a post process of a chemical mechanical polishing (hereafter it may be abbreviated as CMP) process in a manufacturing process of a semiconductor substrate, and in particular, the present invention relates to a cleaning agent for a semiconductor substrate having a tungsten wiring or a tungsten alloy wiring, and a silicon oxide film, on a surface of a substrate, and a method for processing a semiconductor substrate surface.

BACKGROUND ART

In a semiconductor device represented by a silicon semiconductor, finer structure and high integration have been progressing, depending on market needs of high performance, compact sizing or the like. Along with this trend, high degree of flattening technology corresponding to a fine wiring pattern has become essential. In a manufacturing process of a semiconductor substrate, a CMP process has been introduced, for flattening the surface of a wafer having a metal wiring of, for example, a tungsten wiring or the like, by using a polishing slurry containing polishing fines such as, for example, silica or alumina.

In such the CMP process, the polishing fines (particle) such as silica or alumina used in the CMP process, or metal impurities (metal residue) derived from a polished metal wiring, or the like, tend to remain on the surface of the semiconductor substrate (wafer) after polishing. Because these residues affect adversely on electric characteristics of a semiconductor, such as short-circuit between wirings, it is necessary to remove these residues by cleaning the semiconductor substrate (wafer), after the CMP process.

Conventionally, as a cleaning method after the CMP process, there have been known a cleaning method of a semiconductor substrate (wafer), using a cleaning agent combined with a hydrofluoric acid aqueous solution and hydrogen peroxide/ammonia aqueous solution, or a cleaning agent combined with a hydrofluoric acid aqueous solution and hydrogen peroxide hydrochloric acid. However, such the method has become not applicable to a recent wiring formation process, where finer wiring has progressed, because the corrosion to the metal wiring is fierce.

As a method for solving a problem of this corrosion property, there has been proposed a cleaning process using a cleaning agent containing an organic acid such as citric acid or oxalic acid, which have less corrosive property to a metal wiring, and a chelating agent such as amino polycarboxylic acids (for example, Patent Literature 1 or the like). In addition, as a cleaning process of a semiconductor substrate provided a copper wiring on a substrate of a surface, there has been proposed a cleaning process using a cleaning agent containing a compound having a nitrogen atom with an unshared electron pair in a molecule (for example, Patent Literature 2 or the like). Further, as a cleaning process for removing impurities derived from a metal on a substrate of a surface, there has been proposed a cleaning method using an alkaline cleaning agent containing a chelating agent such as an amino polyphosphonic acid and an alkaline compound (for example, Patent Literature 3 or the like), or a purification method using a composition containing a carboxylic acid, a compound containing an amine and phosphonic acid (for example, Patent Literature 4 or the like), or the like. Still further, as a cleaning process of a semiconductor substrate, in which a tungsten wiring or a tungsten alloy wiring are formed on a substrate of a surface, there has been proposed a cleaning method using a neutral or an alkaline cleaning agent containing an organic amine, a quaternary ammonium hydroxide and a chelating agent (for example, Patent Literature 5 or the like).

CITATION LIST

Patent Literature

Patent Literature 1: JP-A-10-72594
Patent Literature 2: WO 2001/071789
Patent Literature 3: WO 2004/042811
Patent Literature 4: JP-A-2003-510840
Patent Literature 5: JP-A-2011-159658

SUMMARY OF INVENTION

Technical Problem

According to these cleaning processes, it is said that it is possible to remove polishing fines (particle) or metal impurities (metal residue) remaining on the surface of the semiconductor substrate (wafer) after a CMP process, without corroding a metal wiring, and they have been applied to many CMP processes. However, depending on constituent materials of the surface of the semiconductor substrate (wafer), not only a problem of insufficient removal property of the polishing fines (particle) by the cleaning agent, has become obvious, in the present cleaning process, but also corrosion of a metal wiring caused by the cleaning agent, has become a problem, along with a finer structure of a metal wiring.

The present invention has been proposed in view of the above-described circumstance, and it is an object of the present invention to provide a cleaning agent to be used in a post process of a chemical mechanical polishing process of a semiconductor substrate, having a tungsten wiring or a tungsten alloy wiring, and a silicon oxide film, which has less corrosion to the tungsten wiring or the tungsten alloy wiring, and is superior in removal property of polishing fines (particle) such as silica or alumina, remaining on the surface of the semiconductor substrate (wafer), in particular, on a surface of a silicon oxide film such as a TEOS film, after the CMP process; and a method for processing a semiconductor substrate surface.

Solution to Problem

The present inventors have intensively studied a way to attain the above-described object, and have completed the present invention composed of the following constitution.

(1) a cleaning agent for a semiconductor substrate to be used in a post process of a chemical mechanical polishing process of the semiconductor substrate having a tungsten wiring or a tungsten alloy wiring, and a silicon oxide film, comprising (A) a phosphonic acid-based chelating agent, (B) a primary or secondary monoamine having at least one alkyl group or hydroxyalkyl group in a molecule, and (C) water, wherein a pH is over 6 and below 7.

(2) a method for processing a semiconductor substrate surface, comprising a process for treating the surface of a semiconductor substrate having a tungsten wiring or a tungsten alloy wiring, and a silicon oxide film, by chemical mechanical polishing; and a process for cleaning the semiconductor substrate after the process by the chemical mechanical polishing, with a cleaning agent for a semiconductor substrate comprising (A) a phosphonic acid-based chelating agent, (B) a primary or secondary monoamine having at least one alkyl group or hydroxyalkyl group in a molecule, and (C) water, wherein a pH is over 6 and below 7.

Advantageous Effects of Invention

The cleaning agent for the semiconductor substrate of the present invention is the one which is capable of sufficiently removing polishing fines (particle) remaining on a silicon oxide film, without corroding a tungsten wiring or a tungsten alloy wiring.

According to the method for processing the semiconductor substrate surface of the present invention, a semiconductor substrate or a semiconductor device superior in contact resistance and not having short-circuit between wirings, can be manufactured easily, by performing a CMP process in a manufacturing process of the semiconductor substrate, and further by cleaning the semiconductor substrate using the cleaning agent for the semiconductor substrate of the present invention, in a post process of the CMP process, because a tungsten wiring or a tungsten alloy wiring is lithe corroded.

DESCRIPTION OF EMBODIMENTS

The cleaning agent for the semiconductor substrate of the present invention is a cleaning agent for a semiconductor substrate to be used in a post process of a chemical mechanical polishing process of the semiconductor substrate having a tungsten wiring or a tungsten alloy wiring, and a silicon oxide film, characterized by containing (A) a phosphonic acid-based chelating agent, (B) a primary or secondary monoamine having at least one alkyl group or hydroxyalkyl group in a molecule (hereafter it may be abbreviated as a primary or secondary monoamine pertaining to the present invention) and (C) water, wherein a pH is over 6 and below 7.

As (A) the phosphonic acid-based chelating agent in the cleaning agent for the semiconductor substrate of the present invention, a compound having at least one phosphonic acid group in a molecule is included, and specifically, for example, the one represented by the following general formula [1], [2] or [3], is included.

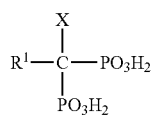

[1]

(wherein X represents a hydrogen atom or a hydroxyl group; and $R^1$ represents a hydrogen atom or an alkyl group having 1 to 10 carbon atoms.)

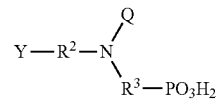

[2]

(wherein Q represents a hydrogen atom or —$R^3$—$PO_3H_2$; $R^2$ and $R^3$ each independently represent an alkylene group; and V represents a hydrogen atom, —$R^3$—$PO_3H_2$ or a group represented by the following general formula [4].)

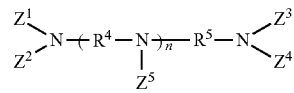

[4]

(wherein Q and $R^3$ are the same as described above.)

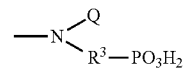

[3]

(wherein $R^4$ and $R^5$ each independently represent an alkylene group having 1 to 4 carbon atoms; "n" represents an integer of 1 to 4; and at least 4 groups of $Z^1$ to $Z^4$ and n moieties of $Z^5$ represent an alkyl group having a phosphonic acid group, and the remaining groups represent an alkyl group.)

The alkyl group having 1 to 10 carbon atoms, represented by $R^1$ in the general formula [1], includes the straight, branched or cyclic one, specifically for example, a methyl group, an ethyl group, a n-propyl group, an isopropyl group, a n-butyl group, an isobutyl group, a s-butyl group, a t-butyl group, a cyclobutyl group, a n-pentyl group, an isopentyl group, a s-pentyl group, a t-pentyl group, a neopentyl group, a 2-methylbutyl group, a 1,2-dimethylpropyl group, an 1-ethylpropyl group, a cyclopentyl group, a n-hexyl group, an isohexyl group, a s-hexyl group, a t-hexyl group, a neohexyl group, a 2-methylpentyl group, a 1,2-dimethylbutyl group, a 2,3-dimethylbutyl group, an 1-ethylbutyl group, a cyclohexyl group, a n-heptyl group, an isoheptyl group, a s-heptyl group, a t-heptyl group, a neoheptyl group, a cycloheptyl group, a n-octyl group, an isooctyl group, a s-octyl group, a t-octyl group, a neooctyl group, an 2-ethylhexyl group, a cyclooctyl group, a n-nonyl group, an isononyl group, a s-nonyl group, a t-nonyl group, a neononyl group, a cyclononyl group, a n-decyl group, an isodecyl group, a s-decyl group, a t-decyl group, a neodecyl group, a cyclodecyl group, a bornyl group, a menthyl group, an adamantyl group, a decahydronaphthyl group, or the like; and among them, a methyl group, an ethyl group, a n-propyl group and an isopropyl group, which are the straight or branched alkyl groups having 1 to 3 carbon atoms, are preferable. It should be noted that, in the specific examples described above, n- represents normal-type, s- represents sec-type, and t- represents tert-type.

As X in the general formula [1], a hydroxyl group is more preferable.

As $R^1$ in the general formula [1], an alkyl group having 1 to 10 carbon atoms is more preferable.

The alkylene group represented by $R^2$ in the general formula [2] includes the straight or branched one having carbon atoms of 1 to 12, specifically for example, a methylene group, an ethylene group, a propylene group, a trimethylene group, an ethylmethylene group, a tetramethylene group, a 2-methylpropylene group, a 2-methyltrimethylene group, an ethylethylene group, a pentamethylene group, a 2,2-dimethyltrimethylene group, an 2-ethyltrimethylene group, a hexamethylene group, a heptamethylene group, an octamethylene group, a 2-ethylhexamethylene group, a nonamethylene group, a decamethylene group, an undecamethylene group, a dodecamethylene group, or the like; and among them, for example, the straight or branched alkylene group having carbon atoms of 1 to 6, such as a methylene group, an ethylene group, a propylene group, a trimethylene group, an ethylmethylene group, a tetramethylene group, a 2-methylpropylene group, a 2-methyltrimethylene group, an ethylethylene group, a pentamethylene group, a 2,2-dimethyltrimethylene group, an 2-ethyltrimethylene group, a hexamethylene group, is preferable; and among them, an ethylene group, which is an alkylene group having 2 carbon atoms, is more preferable.

The alkylene group represented by $R^3$ in the general formulae [2] and [4] includes the straight or branched one having 1 to 10 carbon atoms, specifically for example, a methylene group, an ethylene group, a propylene group, a trimethylene group, an ethylmethylene group, a tetramethylene group, a 2-methylpropylene group, a 2-methyltrimethylene group, an ethylethylene group, a pentamethylene group, a 2,2-dimethyltrimethylene group, an 2-ethyltrimethylene group, a hexamethylene group, a heptamethylene group, an octamethylene group, an 2-ethylhexamethylene group, a nonamethylene group, a decamethylene group, or the like; and among them, a methylene group and an ethylene group, which are the alkylene group having 1 to 2 carbon atoms, are preferable; and among them, a methylene group, which is the alkylene group having 1 carbon atom, is more preferable.

As Q in the general formulae [2] and [4], —$R^3$—$PO_3H_2$ is more preferable.

As Y in the general formula [2], —$R^3$—$PO_3H_2$, or the group represented by the above-mentioned general formula [4] is more preferable; and among them, the group represented by the above-mentioned general formula [4] is particularly preferable.

The alkylene group having 1 to 4 carbon atoms, represented by $R^4$ and $R^5$ in the general formula [3] includes the straight or branched one, specifically for example, a methylene group, an ethylene group, a propylene group, a trimethylene group, an ethylmethylene group, a tetramethylene group, a 2-methylpropylene group, 2-methyltrimethylene group, an ethylethylene group, or the like; and among them, an ethylene group, which is an alkylene group having 2 carbon atoms, is more preferable.

"n" in the general formula [3] is usually an integer of 1 to 4, and preferably an integer of 1 to 2.

The alkyl group and the alkyl group in the alkyl group having the phosphonic acid group, represented by $Z^1$ to $Z^5$ in the general formula [3], include the straight or branched one having 1 to 4 carbon atoms, specifically for example, a methyl group, an ethyl group, a n-propyl group, an isopropyl group, a n-butyl group, an isobutyl group, a s-butyl group, a t-butyl group, or the like; and among them, a methyl group, which is an alkyl group having 1 carbon atom, is preferable. It should be noted that, in the specific examples described above, n- represents normal-type, s- represents sec-type, and t- represents tert-type.

Number of the phosphonic add group in the alkyl group, having the phosphonic acid group represented by $Z^1$ to $Z^5$ in the general formula [3], is usually 1 or 2, and preferably 1.

The alkyl group having the phosphonic acid group, represented by $Z^1$ to $Z^5$ in the general formula [3], includes an alkyl group having one or two phosphonic acid groups, which is the straight or branched one having 1 to 4 carbon atoms, specifically for example, a (mono)phosphonomethyl group, (mono)phosphonoethyl group, a (mono)phosphono-n-propyl group, (mono)phosphonoisopropyl group, a (mono)phosphono-n-butyl group, a (mono)phosphonoisobutyl group, a (mono)phosphono-s-butyl group, a (mono)phosphono-t-butyl group, a diphosphonomethyl group, a diphosphonoethyl group, a diphosphono-n-propyl group, a diphosphonoisopropyl group, a diphosphono-n-butyl group, a diphosphonoisobutyl group, a diphosphono-s-butyl group, a diphosphono-t-butyl group, or the like; and among them, a (mono)phosphonomethyl group and a (mono)phosphonoethyl group, which are the alkyl group having 1 to 2 carbon atoms and one phosphonic acid group, are preferable and among them, a (mono)phosphonomethyl group which is the alkyl group having 1 carbon atom and one phosphonic acid group is more preferable. It should be noted that, in the specific examples described above, n- represents normal-type, s- represents sec-type, and t- represents tert-type.

As the $Z^1$ to $Z^5$ in the general formula [3], it is preferable that all of $Z^1$ to $Z^4$ and n moieties of $Z^5$ are the alkyl group having the phosphonic acid group.

As a preferable specific example of (A) the phosphonic acid-based chelating agent of the present invention, there is included, for example, the phosphonic acid-based chelating agent represented by the general formula [1] such as ethylidenediphosphonic acid, 1-hydroxyethylidene-1,1'-diphosphonic acid [HEDPO], 1-hydroxypropylidene-1,1'-diphosphonic acid, 1-hydroxybutylidene-1,1'-diphosphonic acid; for example, the phosphonic acid-based chelating agent represented by the general formula [2] such as ethylaminobis(methylenephosphonic acid), dodecylaminobis(methylenephosphonic acid), nitrilotris(methylenephosphonic acid) [NTPO], ethylenediamine bis(methylenephosphonic acid) [EDDPO], 1,3-propylenediamine bis(methylenephosphonic acid), ethylenediamine tetra(methylenephosphonic acid) [EDTPO], ethylenediamine tetra(ethylenephosphonic acid), 1,3-propylenediamine tetra(methylenephosphonic acid) [PDTMP], 1,2-diaminopropane tetra(methylenephosphonic acid), 1,6-hexamethylenediamine tetra(methylenephosphonic acid); for example, the phosphonic acid-based chelating agent represented by the general formula [3] such as diethylenetriamine penta(methylenephosphonic acid) [DEPPO], diethylenetriamine penta(ethylenephosphonic acid), triethylenetetramine hexa(methylenephosphonic acid), triethylenetetramine hexa(ethylenephosphonic add); and among them, 1-hydroxyethylidene-1,1'-diphosphonic acid [HEDPO], nitrilotris(methylenephosphonic acid) [NTPO], ethylenediamine tetra(methylenephosphonic acid) [EDTPO] and diethylenetriamine penta(methylenephosphonic acid) [DEPPO] are preferable; and among them, 1-hydroxyethylidene-1,1-diphosphonic acid [HEDPO] is more preferable. It should be noted that, as these phosphonic acid-based chelating agents, one kind thereof may be used alone, or two or more kinds may be used in combination. In addition, in a commercially available phosphonic acid-based chelating agent, there is the one containing water, such as, for example, purified water such as distilled water, deionized water or the like, for example, ultra pure water or the like, other than the phosphonic acid-based chelating agent, however, there is no problem in using the phosphonic acid-based chelating agent containing such kind of water.

As the concentration of (A) the phosphonic acid-based chelating agent in the cleaning agent for the semiconductor substrate of the present invention, as weight % relative to total weight of the cleaning agent for the semiconductor substrate of the present invention, the lower limit thereof is usually 0.0001% by weight or higher, preferably 0.001% by weight or higher, and more preferably 0.01% by weight or higher; and the upper limit thereof is usually 1% by weight or lower, preferably 0.5% by weight or lower, and more preferably 0.2% by weight or lower. In the case where the concentration of the phosphonic acid-based chelating agent is extremely low, there is a tendency that the cleaning effect is not sufficient, and in the case where the concentration of the phosphonic acid-based chelating agent is extremely high, there is a tendency that the phosphonic acid-based chelating agent remains as impurity on a substrate surface, and thus it is not desirable.

It is considered that these (A) the phosphonic acid-based chelating agents exhibit the effect of enhancing a removal property of polishing fines (particle), by binding to the polishing fines (particle) such as silica or alumina, and a silicon oxide film such as a TEOS film at the substrate surface, so as to modify a charge state of the polishing fines (particle) and the silicon oxide film, and enhance repulsion force of both.

(B) the primary or secondary monoamine having at least one alkyl group or hydroxyalkyl group in a molecule, in the cleaning agent for the semiconductor substrate of the present invention, is a compound having at least one alkyl group having 1 to 10 carbon atoms in a molecule, or at least one hydroxyalkyl group having 1 to 10 carbon atoms in a molecule, and also having at least one nitrogen atom in a molecule; and specifically includes, for example, (1) a primary monoamine having one alkyl group having 1 to 10 carbon atoms, (2) a secondary monoamine having two alkyl groups having 1 to 10 carbon atoms, (3) a primary monoamine having one hydroxyalkyl group having 1 to 10 carbon atoms, (4) a secondary monoamine having two hydroxyalkyl groups having 1 to 10 carbon atoms, and (5) a secondary monoamine having one alkyl group having 1 to 10 carbon atoms and one hydroxyalkyl group having 1 to 10 carbon atoms, or the like. It should be noted that the hydroxyalkyl group, referred to in the present specification, means an alkyl group having at least one hydroxyl group, and may have a number of hydroxyl groups.

The alkyl group having 1 to 10 carbon atoms, in the primary or secondary monoamine pertaining to the present invention, includes the straight, branched or cyclic one, specifically for example, a methyl group, an ethyl group, a n-propyl group, an isopropyl group, a n-butyl group, an isobutyl group, a s-butyl group, a t-butyl group, a cyclobutyl group, a n-pentyl group, an isopentyl group, a s-pentyl group, a t-pentyl group, a neopentyl group, a 2-methylbutyl group, a 1,2-dimethylpropyl group, an 1-ethylpropyl group, a cyclopentyl group, a n-hexyl group, an isohexyl group, a s-hexyl group, a t-hexyl group, a neohexyl group, a 2-methylpentyl group, a 1,2-dimethylbutyl group, a 2,3-dimethylbutyl group, an 1-ethylbutyl group, a cyclohexyl group, a n-heptyl group, an isoheptyl group, a s-heptyl group, a t-heptyl group, a neoheptyl group, a cycloheptyl group, a n-octyl group, an isooctyl group, a s-octyl group, a t-octyl group, a neooctyl group, an 2-ethylhexyl group, a cyclooctyl group, a n-nonyl group, an isononyl group, a s-nonyl group, a t-nonyl group, a neononyl group, a cyclononyl group, a n-decyl group, an isodecyl group, a s-decyl group, a t-decyl group, a neodecyl group, a cyclodecyl group, a bornyl group, a menthyl group, an adamantyl group, a decahydronaphthyl group, or the like; and among them, a methyl group and an ethyl group are preferable. It should be noted that, in the specific examples described above, n- represents normal-type, s- represents sec-type, and t- represents tert-type.

The hydroxyalkyl group having 1 to 10 carbon atoms, in the primary or secondary monoamine pertaining to the present invention, includes the straight, branched or cyclic one having 1 to 10 carbon atoms and having at least one hydroxyl group, specifically for example, a hydroxymethyl group, a 1-hydroxyethyl group, a 2-hydroxyethyl group, a 1-hydroxy-n-propyl group, a 2-hydroxy-n-propyl group, a 3-hydroxy-n-propyl group, a 12-dihydroxy-n-propyl group, a 1,3-dihydroxy-n-propyl group, a 2,3-dihydroxy-n-propyl group, a 1-hydroxyisopropyl group, a 2-hydroxyisopropyl group, a 1,2-dihydroxyisopropyl group, a 1,3-dihydroxyisopropyl group, a 1-hydroxy-n-butyl group, a 2-hydroxy-n-butyl group, a 3-hydroxy-n-butyl group, a 4-hydroxy-n-butyl group, a 2-methyl-1,3-dihydroxyisopropyl group, a trihydroxy-t-butyl group (a 2-hydroxymethyl-1,3-dihydroxyisopropyl group), a 1-hydroxy-n-pentyl group, a 2-hydroxy-n-pentyl group, a 3-hydroxy-n-pentyl group, a 4-hydroxy-n-pentyl group, a 5-hydroxy-n-pentyl group, 2-ethyl-1,3-dihydroxyisopropyl group, a 1-hydroxy-n-hexyl group, a 2-hydroxy-n-hexyl group, a 3-hydroxy-n-hexyl group, a 4-hydroxy-n-hexyl group, a 5-hydroxy-n-hexyl group, a 6-hydroxy-n-hexyl group, a 1-hydroxy-n-heptyl group, a 2-hydroxy-n-heptyl group, a 3-hydroxy-n-heptyl group, a 4-hydroxy-n-heptyl group, a 5-hydroxy-n-heptyl group, a 6-hydroxy-n-heptyl group, a 7-hydroxy-n-heptyl group, a 1-hydroxy-n-octyl group, a 2-hydroxy-n-octyl group, a 3-hydroxy-n-octyl group, a 4-hydroxy-n-octyl group, a 5-hydroxy-n-actyl group, a 6-hydroxy-n-octyl group, a 7-hydroxy-n-octyl group, a 8-hydroxy-n-octyl group, a 1-hydroxy-n-nonyl group, a 2-hydroxy-n-nonyl group, a 3-hydroxy-n-nonyl group, a 4-hydroxy-n-nonyl group, a 5-hydroxy-n-nonyl group, a 6-hydroxy-n-nonyl group, a 7-hydroxy-n-nonyl group, a 8-hydroxy-n-nonyl group, a 9-hydroxy-n-nonyl group, a 1-hydroxy-n-decyl group, a 2-hydroxy-n-decyl group, a 3-hydroxy-n-decyl group, a 4-hydroxy-n-decyl group, a 5-hydroxy-n-decyl group, a 6-hydroxy-n-decyl group, a 7-hydroxy-n-decyl group, a 8-hydroxy-n-decyl group, a 9-hydroxy-n-decyl group, a 10-hydroxy-n-decyl group, or the like; and among them, a 2,3-dihydroxy-n-propyl group, a 1,3-dihydroxyisopropyl group, a 2-methyl-1,3-dihydroxyisopropyl group, a trihydroxy-t-butyl group (a 2-hydroxymethyl-1,3-dihydroxyisopropyl group) and a 2-ethyl-1,3-dihydroxyisopropyl group are preferable; and among them, a 1,3-dihydroxyisopropyl group, a 2-methyl-1,3-dihydroxyisopropyl group, a trihydroxy-t-butyl group (a 2-hydroxymethyl-1,3-dihydroxyisopropyl group), a 2-ethyl-1,3-dihydroxyisopropyl group are more preferable; and a trihydroxy-t-butyl group (a 2-hydroxymethyl-1,3-dihydroxyisopropyl group) is particularly preferable. It should be noted that, in the specific examples described above, n- represents normal-type, s- represents sec-type, and t- represents tert-type.

A specific example of the primary or secondary monoamine pertaining to the present invention includes (1) the primary monoamine having one alkyl group having 1 to 10 carbon atoms, such as, for example, monomethylamine, monoethylamine, mono-n-propylamine, monoisopropylamine, mono-n-butylamine, monoisobutylamine, mono-s-butylamine, mono-t-butylamine, monocyclobutylamine, monopentylamine, monohexylamine, monoheptylamine, monooctylamine, mononoylamine, monodecylamine; (2) the secondary monoamine having two alkyl groups having 1 to 10 carbon atoms, such as, for example, dimethylamine, diethylamine, di-n-propylamine, diisopropylamine, di-n-butylamine, diisobutylamine, di-s-butylamine, di-t-butylamine, dicyclobutylamine, dipentylamine, dihexylamine, diheptylamine, dioctylamine, dinonylamine, didecylamine, ethylmethylamine, methylpropylamine, ethylpropylamine; (3) the primary monoamine having one hydroxyalkyl group having 1 to 10 carbon atoms, such as, for example, monoethanolamine, mono-n-propanolamine, 2-amino-2-methyl-1-propanol, 3-amino-1,2-propanediol (2,3-dihydroxypropylamine), 2-amino-1,3-propanediol, mono-n-butanolamine, 2-amino-2-methyl-1,3-propanediol, 2-amino-2-hydroxymethyl-1,3-propanediol (trishydroxymethylaminomethane), monopentanolamine, 2-amino-2-ethyl-1,3-propanediol, monohexanolamine, monoheptanolamine, monooctanolamine, monononanolamine, monodecanolamine; (4) the secondary monoamine having two hydroxyalkyl groups having 1 to 10 carbon atoms, such as, for example, diethanolamine, dipropanolamine, dibutanolamine, dipentanolamine, dihexanolamine, diheptanolamine, dioctanolamine, dinonanolamine, didecanolamine; and (5) the secondary monoamine having one alkyl group having 1 to 10 carbon atoms and one hydroxyalkyl group having 1 to 10 carbon atoms, such as, for example, monomethylmonoethanolamine, monoethylmonoethanolamine, monopropylmonopropanolamine, monobutylmonobutanolamine, monopentylmonopentanolamine, monohexylmonohexanolamine, monoheptylmonoheptanolamine, monooctylmonooctanolamine, monononylmonononanolamine, monodecylmonodecanolamine, 3-methylamino-1,2-propanediol. It should be noted that, as these primary or secondary monoamines, one kind thereof may be used alone, or two or more kinds may be used in combination.

Among these primary or secondary monoamines, (3) the primary monoamine having one hydroxyalkyl group having 1 to 10 carbon atoms, such as, for example, monoethanolamine, mono-n-propanolamine, 2-amino-2-methyl-1-propanol, 3-amino-1,2-propanediol (2,3 dihydroxypropylamine), 2-amino-1,3-propanediol, mono-n-butanolamine, 2-amino-2-methyl-1,3-propanediol, 2-amino-2-hydroxymethyl-1,3-propanediol (trishydroxymethylaminomethane), monopentanolamine, 2-amino-2-ethyl-1,3-propanediol, monohexanolamine, monoheptanolamine, monooctanolamine, monononanolamine, monodecanolamine; (4) the secondary monoamine having two hydroxyalkyl groups having 1 to 10 carbon atoms, such as, for example, diethanolamine, dipropanolamine, dibutanolamine, dipentanolamine, dihexanolamine, diheptanolamine, dioctanolamine, dinonanolamine, didecanolamine; and (5) the secondary monoamine having one alkyl group having 1 to 10 carbon atoms and one hydroxyalkyl group having 1 to 10 carbon atoms, such as, for example, monomethylmonoethanolamine, monoethylmonoethanolamine, monopropylmonopropanolamine, monobutylmonobutanolamine, monopentylmonopentanolamine, monohexylmonohexanolamine, monoheptylmonoheptanolamine, monooctylmonooctanolamine, monononylmonononanolamine, monodecylmonodecanolamine, 3-methylamino-1,2-propanediol are preferable; and among them, the primary or secondary monoamine represented by the following general formula [5] is preferable. The primary or secondary monoamine having one or two alkyl group having 1 to 10 carbon atoms, has higher volatility, as compared with the primary or secondary monoamine having one or two hydroxyalkyl group having carbon 1 to 10 atoms, and thus tends to change compositional ratio of the cleaning agent, while continuing using the cleaning agent for the semiconductor substrate of the present invention. Therefore, it is preferable to use the primary or secondary monoamine having one or two hydroxyalkyl group having 1 to 10 carbon atoms, which little changes compositional ratio of the cleaning agent, even in the case of continuing using the cleaning agent for the semiconductor substrate of the present invention, and has low volatility. Further, among these primary or secondary monoamines, a primary or secondary monoamine represented by the following general formula [5] is more preferable in view of having low corrosion property to tungsten and superior removal performance of the polishing fines (particle).

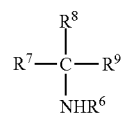

[5]

(wherein $R^6$ and $R^9$ each independently represent a hydrogen atom, an alkyl group having 1 to 3 carbon atoms, or a mono or dihydroxyalkyl group having 1 to 3 carbon atoms; $R^7$ represents a hydrogen atom, or a mono or dihydroxyalkyl group having 1 to 3 carbon atoms; and $R^8$ represents a mono or dihydroxyalkyl group having 1 to 3 carbon atoms, provided that at least two hydroxyl groups are present in $R^7$ to $R^9$.)

The alkyl group having 1 to 3 carbon atoms, represented by $R^6$ and $R^9$ in the general formula [5], includes the straight or branched one, specifically for example, a methyl group, an ethyl group, a n-propyl group, an isopropyl group, or the like; and among them, a methyl group and an ethyl group, which are the alkyl groups having 1 to 2 carbon atoms, are preferable.

The mono or dihydroxyalkyl group having 1 to 3 carbon atoms, represented by $R^6$ and $R^9$ in the general formula [5], includes the straight or branched one, specifically for example, a monohydroxymethyl group, a dihydroxymethyl group, a 1-monohydroxyethyl group, a 2-monohydroxyethyl group, a 1,1-dihydroxyethyl group, a 2,2-dihydroxyethyl group, a 1,2-dihydroxyethyl group, a 1-monohydroxy-n-propyl group, a 2-monohydroxy-n-propyl group, a 3-monohydroxy-n-propyl group, a 1,1-dihydroxy-n-propyl group, a 2,2-dihydroxy-n-propyl group, a 3,3-dihydroxy-n-propyl group, 1,2-dihydroxy-n-propyl group, a 1,3-dihydroxy-n-propyl group, 2,3-dihydroxy-n-propyl group, a 1-monohydroxyisopropyl group, a 2-monohydroxyisopropyl group, a 1,1-dihydroxyisopropyl group, a 1,2-dihydroxyisopropyl group, a 1,3-dihydroxyisopropyl group, or the like; and among them, a monohydroxymethyl group and a 1,2-dihydroxyethyl group are preferable.

As $R^6$ in the general formula [5], a hydrogen atom is more preferable.

As $R^7$ and $R^9$ in the general formula [5], a mono or dihydroxyalkyl group having 1 to 3 carbon atoms is more preferable.

The primary or secondary monoamine represented by the above-mentioned general formula [5] includes a primary monoamine represented by the following general formula [6] or a primary or secondary monoamine represented by the following general formula [7] or the like; and among them, the primary monoamine represented by the following general formula [6] is more preferable.

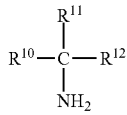

[6]

(wherein $R^{10}$ and $R^{11}$ each independently represent a monohydroxyalkyl group having 1 to 3 carbon atoms; and $R^{12}$ represents a hydrogen atom, an alkyl group having 1 to 3 carbon atoms or a monohydroxyalkyl group having 1 to 3 carbon atoms.)

[7]

(wherein $R^{13}$ represents a hydrogen atom or an alkyl group having 1 to 3 carbon atoms; and $R^{14}$ represents a dihydroxyalkyl group having 1 to 3 carbon atoms.)

The monohydroxyalkyl group having 1 to 3 carbon atoms, represented by $R^{10}$ to $R^{12}$ in the general formulae [6] and [7], includes the straight or branched one, specifically for example, a monohydroxymethyl group, a 1-monohydroxyethyl group, a 2-monohydroxyethyl group, a 1-monohydroxy-n-propyl group, a 2-monohydroxy-n-propyl group, a 3-monohydroxy-n-propyl group, a 1-monohydroxyisopropyl group, a 2-monohydroxyisopropyl group, or the like; and among them, a monohydroxymethyl group is preferable.

The alkyl group having 1 to 3 carbon atoms, represented by $R^{12}$ in the general formula [6], includes the one similar to the alkyl group having 1 to 3 carbon atoms, represented by $R^6$ and $R^9$ in the general formula [5], and a preferable alkyl group includes the one similar to the preferable alkyl group, represented by $R^6$ and $R^9$ in the general formula [5].

As $R^{12}$ in the general formula [6], a monohydroxyalkyl group having 1 to 3 carbon atoms is more preferable.

The alkyl group having 1 to 3 carbon atoms, represented by $R^{13}$ in the general formula [7] includes the one similar to the alkyl group having 1 to 3 carbon atoms, represented by $R^6$ and $R^9$ in the general formula [5], and a preferable alkyl group includes a methyl group.

The dihydroxyalkyl group having 1 to 3 carbon atoms, represented by $R^1$ the general formula [7] includes the straight or branched one, specifically for example, a dihydroxymethyl group, a 1,1-dihydroxyethyl group, a 2,2-dihydroxyethyl group, a 1,2-dihydroxyethyl group, a 1,1-dihydroxy-n-propyl group, a 2,2-dihydroxy-n-propyl group, a 3,3-dihydroxy-n-propyl group, a 1,2-dihydroxy-n-propyl group, a 1,3-dihydroxy-n-propyl group, a 2,3-dihydroxy-n-propyl group, a 1,1-dihydroxyisopropyl group, a 1,2-dihydroxyisopropyl group, a 1,3-dihydroxyisopropyl group, or the like; and among them, a 1,2-dihydroxyethyl group is preferable.

A specific example of the primary monoamine, represented by the general formula [6] includes, for example, 2-amino-1,3-propanediol, 2-amino-2-methyl-1,3-propanediol, 2-amino-2-hydroxymethyl-1,3-propanediol (trishydroxymethylaminomethane), 2-amino-2-ethyl-1,3-propanediol, or the like.

A specific example of the primary or secondary monoamine, represented by the general formula [7] includes, for example, 3-amino-1,2-propanediol (2,3-dihydroxypropylamine), 3-methylamino-1,2-propanediol, or the like.

Among the primary or secondary monoamine represented by the above-mentioned general formula [5], 2-amino-1,3-propanediol, 2-amino-2-methyl-1,3-propanediol, 2-amino-2-hydroxymethyl-1,3-propanediol (trishydroxymethylaminomethane), 2-amino-2-ethyl-1,3-propanediol, 3-amino-1,2-propanediol (2,3-dihydroxypropylamine), 3-methylamino-1,2-propanediol are preferable; and among them, 2-amino-2-hydroxymethyl-1,3-propanediol (trishydroxymethylaminomethane) is particularly preferable. Among the primary or secondary monoamine represented by the above-mentioned general formula [5], the above-mentioned primary or secondary monoamine exemplified as a specific example, is more preferable in view of being further superior in low corrosion property to tungsten and in removing performance of polishing fines (particle); and among them, 2-amino-2-hydroxymethyl-1,3-propanediol (trishydroxymethylaminomethane) is the particularly preferable one in view of not only being superior in low corrosion property to tungsten and in removing performance of the polishing fines (particle), but also in easy availability.

As the concentration of (B) the primary or secondary monoamine having at least one alkyl group or hydroxyalkyl group in a molecule, in the cleaning agent for the semiconductor substrate of the present invention, as weight % relative to total weight of the cleaning agent for the semiconductor substrate of the present invention, the lower limit thereof is usually 0.0001% by weight or higher, preferably 0.001% by weight or higher, and more preferably 0.01% by weight or higher; and the upper limit thereof is usually 1.5% by weight or lower, preferably 1% by weight or lower, and more preferably 0.5% by weight or lower. In the case where the concentration of the primary or secondary monoamine is extremely low, there is a tendency that the cleaning effect is not sufficient, and in the case where the concentration of the primary or secondary monoamine is extremely high, there is a tendency that these monoamines remains as impurity on a substrate surface, and thus it is not desirable.

It is considered that these primary or secondary monoamines exhibit the effect of enhancing a removal property of polishing fines (particle), by binding to the polishing fines (particle) such as silica or alumina, and a silicon oxide film such as a TEES film at the substrate surface, so as to modify a charge state of the polishing fines (particle) and the silicon oxide film, and enhance repulsion force of both.

The present invention is the one characterized by using, in combination, (A) the phosphonic acid-based chelating agent and (B) the primary or secondary monoamine having at least one alkyl group or hydroxyalkyl group in a molecule, as mentioned above, and is capable of effectively removing polishing fines (particle) remaining on a silicon oxide film, by using these in combination, as compared with the case of using alone (A) the phosphonic acid-based chelating agent, or (B) the primary or secondary monoamine having at least one alkyl group or hydroxyalkyl group in a molecule.

The cleaning agent for the semiconductor substrate of the present invention may contain (D) an organic acid, (E) a surfactant or the like, if needed, as other components, in addition to (A) the phosphonic acid-based chelating agent, (B) the primary or secondary monoamine having at least one alkyl group or hydroxyalkyl group in a molecule and (C) water, which are constituents.

(D) the organic acid may be added as appropriate, from a standpoint of removal property of polishing fines (particle), and from a standpoint of an adjuster of a pH. Such (D) the organic acid includes, an aliphatic monocarboxylic acid, such as, for example, formic acid, acetic acid, trifluoroacetic acid, propionic acid, butyric acid, valeric acid, caproic acid, enanthic acid, caprylic acid, pelargonic acid, capric acid, lauric acid; an aliphatic dicarboxylic acid, such as, for example, oxalic acid, malonic acid, succinic acid, glutaric acid, adipic acid, pimelic acid, maleic acid, fumaric acid; an aliphatic hydroxycarboxylic acid, such as, for example, lactic acid, malic acid, tartaric acid, citric acid; an aliphatic tricarboxylic acid, such as, for example, aconitic acid; an aliphatic oxocarboxylic acid, such as, for example, pyruvic acid; an aromatic monocarboxylic acid, such as, for example, benzoic acid; an aromatic dicarboxylic acid, such as, for example, phthalic acid, isophthalic acid, terephthalic acid; an aromatic hydroxycarboxylic acid, such as, for example, salicylic acid, gallic acid; and an aromatic hexacarboxylic acid, such as, for example, mellitic acid; and among them, citric acid is preferable. It should be noted that, as these organic acids, one kind thereof may be used alone, or two or more kinds may be used in combination. In addition, for convenience of explanation, a carboxylic acid having at least one hydroxyl group in a molecule, is classified to a hydroxycarboxylic acid, regardless of the number of the carboxyl group.

As the concentration of the organic acid, in the case where (D) the organic acid is added, as weight % relative to total weight of the cleaning agent for the semiconductor substrate of the present invention, the lower limit thereof is usually 0.0001% by weight or higher, preferably 0.0005% by weight or higher, and more preferably 0.001% by weight or higher; and the upper limit thereof is usually 0.5% by weight or lower, preferably 0.1% by weight or lower, and more preferably 0.05% by weight or lower.

(E) the surfactant may be added as appropriate, from a standpoint of removal property of polishing fines (particle), and from a standpoint of low corrosion property to a tungsten wiring or a tungsten alloy wiring. Such (E) the surfactant includes, for example, a cationic surfactant, an anionic surfactant, a nonionic surfactant, an ampholytic surfactant or the like. A specific example of the cationic surfactant includes, a primary to tertiary alkylamine salt, such as, for example, monostearylammonium chloride, distearylammonium chloride, tristearylammonium chloride; and a modified aliphatic polyamine, such as, for example, polyethylenepolyamine. A specific example of the anionic surfactant includes an anionic surfactant having a carboxylic group in a molecule, such as, for example, an alkylcarboxylic acid sodium salt, an alkylcarboxylic acid potassium salt, an alkylcarboxylic acid ammonium salt, an alkylbenzene carboxylic acid sodium salt, an alkylbenzene carboxylic acid potassium salt, an alkylbenzene carboxylic acid ammonium salt, a polyoxyalkylene alkylether carboxylic acid sodium salt, a polyoxyalkylene alkylether carboxylic acid potassium salt, a polyoxyalkylene alkylether carboxylic acid ammonium salt, an N-acylsarcosine acid sodium salt, an N-acylsarcosine acid potassium salt, an N-acylsarcosine acid ammonium salt, an N-acylglutamic acid sodium salt, an N-acylglutamic acid potassium salt, an N-acylglutamic acid ammonium salt; an anionic surfactant having a sulfonic acid group in a molecule, such as, for example, an alkylsulfonic add sodium salt, an alkylsulfonic acid potassium salt, an alkylsulfonic acid ammonium salt, an alkylbenzene sulfonic acid, such as, for example, dodecylbenzene sulfonic acid, an alkylbenzene sulfonic acid sodium salt, such as, for example, sodium dodecylbenzene sulfonate, an alkylbenzene sulfonic acid potassium salt, such as, for example, potassium dodecylbenzene sulfonate, an alkylbenzene sulfonic acid ammonium salt, such as, for example, ammonium dodecylbenzene sulfonate, an alkylnaphthalenesulfonic acid sodium salt, an alkylnaphthalenesulfonic acid potassium salt, an alkylnaphthalenesulfonic acid ammonium salt, a polyoxyalkylene alkylethersulfonic acid sodium salt, a polyoxyalkylene alkylethersulfonic acid potassium salt, a polyoxyalkylene alkylethersulfonic acid ammonium salt, a N-methyl-N-acyltaurine sodium salt, a N-methyl-N-acyltaurine potassium salt, a N-methyl-N-acyltaurine ammonium salt, a dialkylsulfosuccinic acid sodium salt, such as, for example, sodium dioctylsulfosuccinate, a dialkylsulfosuccinic acid potassium salt, such as, for example, potassium dioctylsulfosuccinate, a dialkylsulfosuccinic acid ammonium salt, such as, for example, ammonium dioctylsulfosuccinate; an anionic surfactant having a sulfate ester group in a molecule, such as a sodium alkylsulfate salt, such as, for example, sodium lauryl sulfate, a potassium alkylsulfate salt, such as, for example, potassium lauryl sulfate, an ammonium alkylsulfate salt, such as, for example, ammonium lauryl sulfate; an anionic surfactant having a phosphonic acid group in a molecule, such as, for example, an alkylphosphonic acid sodium salt, an alkylphosphonic acid potassium salt, an alkylphosphonic acid ammonium salt, an alkylbenzenephosphonic acid sodium salt, an alkylbenzenephosphonic acid potassium salt, an alkylbenzenephosphonic acid ammonium salt, a polyoxyalkylene alkylether phosphonic acid sodium salt, a polyoxyalkylene alkylether phosphonic acid potassium salt, a polyoxyalkylene alkylether phosphonic acid ammonium salt, or the like. A specific example of the nonionic surfactant includes, a polyoxyethylene alkylether, such as, for example, polyoxyethylene stearylether, a polyoxyethylene alkenylether, such as, for example, polyoxyethylene oleylether, a polyoxyalkylene alkylphenylether, such as, for example, polyoxyethylene nonylphenylether, a polyoxyalkylene glycol, such as, for example, polyoxypropylene polyoxyethylene glycol, a polyoxyethylene monoalkylate, such as, for example, polyoxyethylene monostearate; a bispolyoxyethylene alkylamine, such as, for example, bispolyoxyethylene stearylamine, a bispolyoxyethylene alkylamide, such as, for example, bispolyoxyethylene stearylamide, an alkylamineoxide, such as for example, N,N-dimethylalkylamine oxide, or the like. A specific example of the ampholytic surfactant includes, a carboxybetaine, such as, for example, alkyl-N,N-dimethylamino acetic acid betaine, alkyl-N,N-dihydroxyethylamino acetic acid betaine; a sulfobetaine, such as, for example, alkyl-N,N-dimethylsulfoethylene ammonium betaine; an imidazolinium betaine, such as, for example, 2-alkyl-N-carboxymethyl-N-hydroxyethyl imidazolinium betaine, or the like. It should be noted that, as these surfactants, one kind thereof may be used alone, or two or more kinds may be used in combination.

As the concentration of the surfactant, in the case where (E) the surfactant is added, as weight % relative to total weight of the cleaning agent for the semiconductor substrate of the present invention, the lower limit thereof is usually 0.0001% by weight or higher, preferably 0.0005% by weight or higher, and more preferably 0.001% by weight or higher; and the upper limit thereof is usually 0.5% by weight or lower, preferably 0.1% by weight or lower, and more preferably 0.05% by weight or lower.

The cleaning agent for the semiconductor substrate of the present invention can be prepared by dissolving (A) the phosphonic acid-based chelating agent, (B) the primary or secondary monoamine having at least one alkyl group or hydroxyalkyl group in a molecule, and (D) the organic acid and/or (E) the surfactant, if needed, in (C) water, so as to attain the above-described % by weight. It should be noted that the preparation method is not especially limited and, for example, the one where (A) the phosphonic acid-based chelating agent is dissolved in suitable amount of (C) water, the one where (B) the primary or secondary monoamine having at least one alkyl group or hydroxyalkyl group in a molecule is dissolved in suitable amount of (C) water, the one where (D) the organic acid, if needed, is dissolved in suitable amount of (C) water, and the one where (E) the surfactant, if needed, is dissolved in suitable amount of (C) water, may be mixed as appropriate; or (A) the phosphonic acid-based chelating agent, (B) the primary or secondary monoamine having at least one alkyl group or hydroxyalkyl group in a molecule, and (D) organic acid and/or (E) surfactant, if needed, are sequentially added and dissolved in (C) water in appropriate order. The cleaning agent for the semiconductor substrate of the present invention prepared in this way may be subjected to filtration treatment or the like before use.

(C) Water to be used here is not especially limited, as long as it applies to water for the cleaning process after the CMP process, and specifically includes, for example, purified water such as distilled water, deionized water, for example, ultra pure water or the like; and among them, ultra pure water is preferable. Ultra pure water is preferable in view of not adversely affecting on a substrate, in the cleaning process, because of little containing impurities.

As a mixing apparatus to be used in preparing the cleaning agent for the semiconductor substrate of the present invention, for example, an agitator or a disperser or the like can be used. The agitator includes, for example, a mechanical stirrer, a magnetic stirrer or the like, in addition, the disperser includes, for example, a homogenizer, an ultrasonic disperser, a ball mill, a beads mill or the like.

It is desirable that the cleaning agent for the semiconductor substrate of the present invention prepared in this way has a pH of over 6 and below 7, at 25° C. Among them, from a standpoint of removing polishing fines (particle), and from a standpoint of low corrosion property to a tungsten wiring or a tungsten alloy wiring, or the like, the pH of 6.2 to 6.8 is more preferable. The case where the pH of the cleaning agent for the semiconductor substrate of the present invention is 7 or higher, increases corrosion tendency of the tungsten wiring or the tungsten alloy wiring, and the case where the pH is 6 or lower, tends to deteriorate removal property of the polishing fines (particle), and thus it is not desirable.

The pH of the cleaning agent for the semiconductor substrate of the present invention is measured using a commercially available pH meter, in accordance with JIS Z8802-1984, without dilution.

It is desirable that the cleaning agent for the semiconductor substrate of the present invention does not contain a quaternary ammonium hydroxide. The quaternary ammonium hydroxide, referred to in the present specification, includes a tetraalkyl ammonium hydroxide, a (hydroxyalkyl)trialkyl ammonium hydroxide, a bis(hydroxyalkyl)dialkyl ammonium hydroxide, a tris(hydroxyalkyl)alkyl ammonium hydroxide, or the like; and more specifically is, for example, tetramethyl ammonium hydroxide, tetraethyl ammonium hydroxide, tetrapropyl ammonium hydroxide, tetrabutyl ammonium hydroxide, (hydroxyethyl)trimethyl ammonium hydroxide [choline], or the like. The addition of such the quaternary ammonium hydroxide to the cleaning agent for the semiconductor substrate of the present invention tends to deteriorate removal performance of polishing fines (particle), and thus the addition of such the quaternary ammonium hydroxide to the cleaning agent for the semiconductor substrate of the present invention is not desirable.

A cleaning agent containing each component of the above-mentioned (A) to (E), for example, in a high concentration of 10 times to 100 times, when not in use, for example, in storage or in distribution or the like, is also included in the cleaning agent for the semiconductor substrate of the present invention. Such the cleaning agent is used by dilution with water as appropriate, so that content (concentration) of each component becomes the above-described range.

The semiconductor substrate pertaining to the present invention is a semiconductor substrate having at least a tungsten wiring or a tungsten alloy wiring, and a silicon oxide film. The tungsten alloy referred to in the present specification is a tungsten alloy having tungsten (W) as a main component, and includes, for example, an alloy composed of one or more kinds of metals selected from titanium (Ti), iron (Fe), nickel (Ni), copper (Cu), molybdenum (Mo), tantalum (Ta) or the like, and tungsten (W). Such a specific example includes, for example, a titanium-tungsten (TiW) alloy, an iron-tungsten (FeW) alloy, a nickel-tungsten (NiW) alloy, a copper-tungsten (CuW) alloy, a molybdenum-tungsten (MoW) alloy, a tantalum-tungsten (TaW) alloy, or the like; and among them, the titanium-tungsten (TiW) alloy is preferable.

The silicon oxide film in the semiconductor substrate pertaining to the present invention is an oxide film present at the surface of a silicon substrate, such as, for example, a silicon (Si) substrate or a silicon carbide (SiC) substrate, and refers to an oxide film having silicon of, for example, a $SO_2$ film, a $Si(OC_2H_5)$ film [TEOS film] or the like, as a main component. Among such the silicon oxide films, the TEOS film is more preferable. That is, because the cleaning agent for the semiconductor substrate of the present invention is capable of also well removing polishing fines (particle) on the surface of the TEOS film, that it is considered difficult using a conventional cleaning agent, the TEOS film is more preferable.

The semiconductor substrate pertaining to the present invention may have an insulating film such as a $Si_3N_4$ film (a silicon nitride film), other than the tungsten wiring or the tungsten alloy wiring and the silicon oxide film. That is, the cleaning agent for the semiconductor substrate of the present invention has characteristics of being capable of well removing polishing fines (particle) on the surface of the $Si_3N_4$ film (the silicon nitride film).

The semiconductor substrate pertaining to the present invention may have a barrier metal, which prevents diffusion of a tungsten metal or a tungsten alloy in the tungsten wiring or the tungsten alloy wiring to the insulating film. Such the barrier metal includes, specifically, for example, titanium (Ti), titanium nitride (TiN), tantalum (Ta), tantalum nitride (TaN), or the like.

The cleaning agent for the semiconductor substrate of the present invention is the one to be used for the above-mentioned substrate, for example, after provided to the CMP process, to be described later.

The method for processing the semiconductor substrate surface of the present invention is characterized by comprising a process for treating a surface of the above-described semiconductor substrate by chemical mechanical polishing (a polishing process), and a process for cleaning the above-mentioned semiconductor substrate after the process by the chemical mechanical polishing with the above-mentioned cleaning agent for the semiconductor substrate of the present invention (a cleaning process).

As the polishing process in the method for processing the semiconductor substrate surface of the present invention, a method performed in a CMP process known per se is included, and a method itself for polishing a substrate surface is not limited. That is, as a polishing agent, a polishing method, polishing time or the like for polishing the substrate surface, a method known per se may be employed. For example, the method for polishing the substrate surface by using the polishing agent includes a free abrasive coating method for polishing the substrate surface using an alkaline aqueous free polishing agent containing polishing fines such as silica or alumina, a chelating agent such as ethylenediamine tetraacetic acid [EDTA], and an alkaline compound such as potassium hydroxide, tetramethyl ammonium hydroxide, piperazine; and for example, a fixed abrasive coating method for polishing the substrate surface using a polisher where the polishing fines is fixed, and a coolant, or the like. For example, the polishing method includes a single-side polishing method, a double-side polishing method, or the like. For example, the polishing time includes 1 minute to 60 minutes or the like.

The cleaning process in the method for processing the semiconductor substrate surface of the present invention, as a specific example, can be attained, for example, by contacting the cleaning agent for the semiconductor substrate of the present invention with the semiconductor substrate pertaining to the present invention after the CMP process. A contact method is not especially limited, as long as it is a method usually performed in this field, such as, for example, a dipping method, a spin (dropping) method, a spray method, or the like.

The cleaning process in the method for processing the semiconductor substrate surface of the present invention may employ any of a single wafer processing or a batch processing. The single wafer processing is what is called a cleaning method generally using, for example, a brush or the like, while instilling the cleaning agent for the semiconductor substrate of the present invention, by rotating the semiconductor substrate one by one. The batch processing is what is called a cleaning method generally by dipping multiple pieces of the semiconductor substrates into the cleaning agent for the semiconductor substrate of the present invention.

Cleaning temperature in the cleaning process in the method for processing the semiconductor substrate surface of the present invention is not especially limited, as long as it is cleaning temperature usually performed in this field, and for example, is 10° C. to 40° C., or the like. In addition, cleaning time is not especially limited, as long as it is cleaning time usually performed in this field, and for example, is 10 seconds to 300 seconds, or the like.

EXAMPLES

The present invention will be explained below specifically, based on Examples and Comparative Examples, however, the present invention should not be restricted to these Examples. It should be noted that "%" in the following Examples is weight basis (w/w) %, unless specified otherwise.

Example 1

Into a 100 mL polyethylene container, after 24.0 mg of 1-hydroxyethylidene-1,1'-diphosphonic acid (A-1) (product name: Chelest, produced by Chelest Corp.) and 11.9 mg of ethylamine (B-1) (produced by Wako Pure Chemical Industries, Ltd.) were added, (C) water was added so as to attain a total weight of 60 g. The solution was stirred with a magnetic stirrer to obtain a cleaning agent for a semiconductor substrate of the present invention. A pH of the obtained cleaning agent was 6.6. The relevant cleaning agent was referred to as a cleaning agent 1.

Example 2

A cleaning agent for a semiconductor substrate of the present invention was obtained by performing a similar protocol to that in Example 1, except using 16.2 mg of ethanolamine (B-2) (produced by Wako Pure Chemical Industries, Ltd.), instead of (B-1) in Example 1. A pH of the obtained cleaning agent was 6.6. The relevant cleaning agent was referred to as a cleaning agent 2.

Example 3

A cleaning, agent for a semiconductor substrate of the present invention was obtained by performing a similar protocol to that in Example 1, except using 27.5 mg of diethanolamine (B-3) (produced by Wako Pure Chemical Industries, Ltd.), instead of (B-1) in Example 1. A pH of the obtained cleaning agent was 6.6. The relevant cleaning agent was referred to as a cleaning agent 3.

Example 4

A cleaning agent for a semiconductor substrate of the present invention was obtained by performing a similar protocol to that in Example 1, except using 34.1 mg of 2-amino-2-hydroxymethyl-1,3-propanediol (B-4) (produced by Wako Pure Chemical Industries, Ltd.), instead of (B-1) in Example 1. A pH of the obtained cleaning agent was 6.6. The relevant cleaning agent was referred to as a cleaning agent 4.

Example 5

A cleaning agent for a semiconductor substrate of the present invention was obtained by performing a similar protocol to that in Example 1, except using 27.6 mg of 2-amino-2-methyl-1,3-propanediol (B-5) (produced by Wako Pure Chemical Industries, Ltd.), instead of (B-1) in Example 1. A pH of the obtained cleaning agent was 6.5. The relevant cleaning agent was referred to as a cleaning agent 5.

Example 6

A cleaning agent for a semiconductor substrate of the present invention was obtained by performing a similar protocol to that in Example 1, except using 25.0 mg of 2-amino-1,3-propanediol (B-7) (produced by Wako Pure Chemical Industries, Ltd.), instead of (B-1) in Example 1. A pH of the obtained cleaning agent was 6.6. The relevant cleaning agent was referred to as a cleaning agent 6.

Example 7

A cleaning agent for a semiconductor substrate of the present invention was obtained by performing a similar protocol to that in Example 1, except using 24.5 mg of 3-amino-1,2-propanediol (B-8) (produced by Wako Pure Chemical Industries, Ltd.), instead of (B-1) in Example 1. A pH of the obtained cleaning agent was 6.6. The relevant cleaning agent was referred to as a cleaning agent 7.

Example 8

A cleaning agent for a semiconductor substrate of the present invention was obtained by performing a similar protocol to that in Example 1, except using 27.4 mg of 3-methylamino-1,2-propanediol (B-9) (produced by Wako Pure Chemical Industries, Ltd.), instead of (8-1) in Example 1. A pH of the obtained cleaning agent was 6.6. The relevant cleaning agent was referred to as a cleaning agent 8.

Example 9

A cleaning agent for a semiconductor substrate of the present invention was obtained by performing a similar protocol to that in Example 1, except using 35.2 mg of ethylenediamine tetra(methylenephosphonic acid) (A-2) (produced by Wako Pure Chemical Industries, Ltd.), instead of (A-1) in Example 1. A pH of the obtained cleaning agent was 6.6. The relevant cleaning agent was referred to as a cleaning agent 9.

Example 10

A cleaning agent for a semiconductor substrate of the present invention was obtained by performing a similar protocol to that in Example 9, except using 18.0 mg of (B-2) (produced by Wako Pure Chemical Industries, Ltd.), instead of (B-1) in Example 9. A pH of the obtained cleaning agent was 6.6. The relevant cleaning agent was referred to as a cleaning agent 10.

Example 11

A cleaning agent for a semiconductor substrate of the present invention was obtained by performing a similar protocol to that in Example 9, except using 30.6 mg of (B-3) (produced by Wako Pure Chemical Industries, Ltd.), instead of (B-1) in Example 9. A pH of the obtained cleaning agent was 6.6. The relevant cleaning agent was referred to as a cleaning agent 11.

Example 12

A cleaning agent for a semiconductor substrate of the present invention was obtained by performing a similar protocol to that in Example 9, except using 38.9 mg of (B-4) (produced by Wako Pure Chemical Industries, Ltd.), instead of (B-1) in Example 9. A pH of the obtained cleaning agent was 6.8. The relevant cleaning agent was referred to as a cleaning agent 12.

Example 13

A cleaning agent for a semiconductor substrate of the present invention was obtained by performing a similar protocol to that in Example 9, except using 30.6 mg of (B-5) (produced by Wako Pure Chemical Industries, Ltd.), instead of (B-1) in Example 9. A pH of the obtained cleaning agent was 6.6. The relevant cleaning agent was referred to as a cleaning agent 13.

Example 14

A cleaning agent for a semiconductor substrate of the present invention was obtained by performing a similar protocol to that in Example 9, except using 34.6 mg of 2-amino-2-ethyl-1,3-propanediol (B-6) (produced by Tokyo Chemical Industry Co., Ltd.), instead of (B-1) in Example 9. A pH of the obtained cleaning agent was 6.6. The relevant cleaning agent was referred to as a cleaning agent 14.

Example 15

A cleaning agent for a semiconductor substrate of the present invention was obtained by performing a similar protocol to that in Example 9, except using 29.9 mg of (B-7) (produced by Wake Pure Chemical Industries, Ltd.), instead of (B-1) in Example 9. A pH of the obtained cleaning agent was 6.8. The relevant cleaning agent was referred to as a cleaning agent 15.

Example 16

A cleaning agent for a semiconductor substrate of the present invention was obtained by performing a similar protocol to that in Example 9, except using 27.2 mg of (B-8) (produced by Wako Pure Chemical Industries, Ltd.), instead of (B-1) in Example 9. A pH of the obtained cleaning agent was 6.7. The relevant cleaning agent was referred to as a cleaning agent 16.

Example 17

A cleaning agent for a semiconductor substrate of the present invention was obtained by performing a similar protocol to that in Example 9, except using 33.9 mg of (B-9) (produced by Wake Pure Chemical Industries, Ltd.), instead of (B-1) in Example 9. A pH of the obtained cleaning agent was 6.7. The relevant cleaning agent was referred to as a cleaning agent 17.

Example 18

A cleaning agent for a semiconductor substrate of the present invention was obtained by performing a similar protocol to that in Example 2, except using 50.6 mg of nitrilotris(methylenephosphonic acid) (A-3) (produced by Tokyo Chemical Industry Co., Ltd.), instead of (A-1) in Example 2. A pH of the obtained cleaning agent was 6.7. The relevant cleaning agent was referred to as a cleaning agent 18.

Example 19

A cleaning agent for a semiconductor substrate of the present invention was obtained by performing a similar protocol to that in Example 18, except using 76.4 mg of (B-4) (produced by Wake Pure Chemical Industries, Ltd.), instead of (B-2) in Example 18. A pH of the obtained cleaning agent was 6.7. The relevant cleaning agent was referred to as a cleaning agent 19.

Example 20

A cleaning agent for a semiconductor substrate of the present invention was obtained by performing a similar protocol to that in Example 18, except using 64.3 mg of (B-5) (produced by Wako Pure Chemical Industries, Ltd.), instead of (B-2) in Example 18. A pH of the obtained cleaning agent was 6.6. The relevant cleaning agent was referred to as a cleaning agent 20.

Example 21

A cleaning agent for a semiconductor substrate of the present invention was obtained by performing a similar protocol to that in Example 18, except using 58.2 mg of (B-7) (produced by Wake Pure Chemical Industries, Ltd.), instead of (B-2) in Example 18. A pH of the obtained cleaning agent was 6.6. The relevant cleaning agent was referred to as a cleaning agent 21.

Example 22

A cleaning agent for a semiconductor substrate of the present invention was obtained by performing a similar protocol to that in Example 18, except using 54.4 mg of (B-8) (produced by Wake Pure Chemical Industries, Ltd.), instead of (B-2) in Example 18. A pH of the obtained cleaning agent was 6.5. The relevant cleaning agent was referred to as a cleaning agent 22.

Example 23

A cleaning agent for a semiconductor substrate of the present invention was obtained by performing a similar protocol to that in Example 4, except using 66.9 mg of diethylenetriamine penta(methylenephosphonic acid) (A-4) (produced by Wake Pure Chemical Industries, Ltd.), instead of (A-1) in Example 4. A pH of the obtained cleaning agent was 6.6. The relevant cleaning agent was referred to as a cleaning agent 23.

Example 24

A cleaning agent for a semiconductor substrate of the present invention was obtained by performing a similar protocol to that in Example 23, except using 83.8 mg of (B-7) (produced by Wake Pure Chemical Industries, Ltd.), instead of (B-4) in Example 23. A pH of the obtained cleaning agent was 6.6. The relevant cleaning agent was referred to as a cleaning agent 24.

Example 25

A cleaning agent for a semiconductor substrate of the present invention was obtained by performing a similar protocol to that in Example 23, except using 80.0 mg of (B-8) (produced by Wake Pure Chemical Industries, Ltd.), instead of (B-4) in Example 23. A pH of the obtained cleaning agent was 6.6. The relevant cleaning agent was referred to as a cleaning agent 25.

Example 26

A cleaning agent for a semiconductor substrate of the present invention was obtained by performing a similar protocol to that in Example 4, except adding 27.0 mg of dodecylbenzene sulfonic acid (abbreviated name: DBSA, produced by Wake Pure Chemical Industries, Ltd.) in Example 4. A pH of the obtained cleaning agent was 6.8. The relevant cleaning agent was referred to as a cleaning agent 26.

Example 27

A cleaning agent for a semiconductor substrate of the present invention was obtained by performing a similar protocol to that in Example 4, except adding 27.0 mg of sodium dodecylbenzene sulfonate (abbreviated name: DBS, produced by Lion Corp.) in Example 4. A pH of the obtained cleaning agent was 6.8. The relevant cleaning agent was referred to as a cleaning agent 27.

Example 28

A cleaning agent for a semiconductor substrate of the present invention was obtained by performing a similar protocol to that in Example 4, except adding 27.0 mg of ammonium dodecylbenzene sulfonate (abbreviated name: DBSN, produced by Wako Pure Chemical Industries, Ltd.) in Example 4. A pH of the obtained cleaning agent was 6.8. The relevant cleaning agent was referred to as a cleaning agent 28.

Example 29

A cleaning agent for a semiconductor substrate of the present invention was obtained by performing a similar protocol to that in Example 4, except adding 27.0 mg of sodium lauryl sulfate (abbreviated name; SDS, produced by Wako Pure Chemical Industries, Ltd.) in Example 4. A pH of the obtained cleaning agent was 6.8. The relevant cleaning agent was referred to as a cleaning agent 29.

Example 30

A cleaning agent for a semiconductor substrate of the present invention was obtained by performing a similar protocol to that in Example 4, except adding 27.0 mg of ammonium lauryl sulfate (product name: EMAL AD-25R, produced by Kao Corp.) in Example 4. A pH of the obtained cleaning agent was 6.8. The relevant cleaning agent was referred to as a cleaning agent 30.

Example 31

A cleaning agent for a semiconductor substrate of the present invention was obtained by performing a similar protocol to that in Example 4, except adding 27.0 mg of sodium dioctyl sulfosuccinate (product name: PELEX OT-P, produced by Kao Corp.) in Example 4. A pH of the obtained cleaning agent was 6.8. The relevant cleaning agent was referred to as a cleaning agent 31.

Comparative Example 1

A cleaning agent for a semiconductor substrate for comparison was obtained by performing a similar protocol to that in Example 1 except not using (A-1) in Example 1. A pH of the obtained cleaning agent was 11.1. The relevant cleaning agent was referred to as a cleaning agent 32.

Comparative Example 2

A cleaning agent for a semiconductor substrate for comparison was obtained by performing a similar protocol to that in Example 1, except not using (A-1), and using 19.5 mg of diethylamine (B-10) (produced by Wako Pure Chemical Industries, Ltd.), instead of (B-1) in Example 1. A pH of the obtained cleaning agent was 11.3. The relevant cleaning agent was referred to as a cleaning agent 33.

Comparative Example 3

A cleaning agent for a semiconductor substrate for comparison was obtained by performing a similar protocol to that in Example 2, except not using (A-1) in Example 2. A pH of the obtained cleaning agent was 10.5. The relevant cleaning agent was referred to as a cleaning agent 34.

Comparative Example 4

A cleaning agent for a semiconductor substrate for comparison was obtained by performing a similar protocol to that in Example 3, except not using (A-1) in Example 3. A pH of the obtained cleaning agent was 10.1. The relevant cleaning agent was referred to as a cleaning agent 35.

Comparative Example 5

A cleaning agent for a semiconductor substrate for comparison was obtained by performing a similar protocol to that in Example 4, except not using (A-1) in Example 4. A pH of the obtained cleaning agent was 9.4. The relevant cleaning agent was referred to as a cleaning agent 36.

Comparative Example 6

A cleaning agent for a semiconductor substrate for comparison was obtained by performing a similar protocol to that in Example 1, except not using (B-1) in Example 1. A pH of the obtained cleaning agent was 2.6. The relevant cleaning agent was referred to as a cleaning agent 37.

Comparative Example 7

A cleaning agent for a semiconductor substrate for comparison was obtained by performing a similar protocol to that in Example 1, except not using (B-1), and adding 22.5 mg of tetramethylammonium hydroxide (abbreviated name: TMAH, produced by Wako Pure Chemical Industries, Ltd.), in Example 1. A pH of the obtained cleaning agent was 6.7. The relevant cleaning agent was referred to as a cleaning agent 38.

Comparative Example 8

A cleaning agent for a semiconductor substrate for comparison was obtained by performing a similar protocol to that in Example 2, except changing the concentration of (B-2) (produced by Wako Pure Chemical Industries, Ltd.) from 16.2 mg to 15.9 mg, and adding 22.5 mg of tetramethylammonium hydroxide (abbreviated name: TMAH, produced by Wako Pure Chemical Industries, Ltd.) and 16.3 mg of citric acid (produced by Wako Pure Chemical industries, Ltd.), in Example 2. A pH of the obtained cleaning agent was 6.7. The relevant cleaning agent was referred to as a cleaning agent 39.

Comparative Example 9

A cleaning agent for a semiconductor substrate for comparison was obtained by performing a similar protocol to that in Example 2, except changing the concentration of (B-2) (produced by Wako Pure Chemical Industries, Ltd.) from 162 mg to 15.7 mg, and adding 12.9 mg of tetramethylammonium hydroxide (abbreviated name: TMAH, produced by Wako Pure Chemical Industries, Ltd.), in Example 2. A pH of the obtained cleaning agent was 6.7. The relevant cleaning agent was referred to as a cleaning agent 40.

Comparative Example 10

A cleaning agent for a semiconductor substrate for comparison was obtained by performing a similar protocol to that in Example 4, except adding 22.5 mg of tetramethylammonium hydroxide (abbreviated name: TMAH, produced by Wako Pure Chemical Industries, Ltd.) and 17.6 mg of citric acid (produced by Wako Pure Chemical Industries, Ltd.) in Example 4. A pH of the obtained cleaning agent was 6.7. The relevant cleaning agent was referred to as a cleaning agent 41.

Comparative Example 11

A cleaning agent for a semiconductor substrate for comparison was obtained by performing a similar protocol to that in Example 4, except changing the concentration of (B-4) (produced by Wako Pure Chemical Industries, Ltd.) from 34.1 mg to 17.4 mg, and adding 10.7 mg of tetramethylammonium hydroxide (abbreviated name: TMAH, produced by Wako Pure Chemical Industries, Ltd.), in Example 4. A pH of the obtained cleaning agent was 6.6. The relevant cleaning agent was referred to as a cleaning agent 42.

Comparative Example 12

A cleaning agent for a semiconductor substrate for comparison was obtained by performing a similar protocol to that in Example 1, except using 26.7 mg of triethylamine (B-11) (produced by Wako Pure Chemical Industries, Ltd.), instead of (B-1) in Example 1. A pH of the obtained cleaning agent was 6.7. The relevant cleaning agent was referred to as a cleaning agent 43.

Comparative Example 13

A cleaning agent for a semiconductor substrate for comparison was obtained by performing a similar protocol to that in Example 1, except using 42.1 mg of triethanolamine (B-12) (produced by Wako Pure Chemical Industries. Ltd.), instead of (B-1) in Example 1. A pH of the obtained cleaning agent was 6.5. The relevant cleaning agent was referred to as a cleaning agent 44.

Comparative Example 14

A cleaning agent for a semiconductor substrate for comparison was obtained by performing a similar protocol to that in Example 1, except using 9.2 mg of ethylenediamine (B-13) (produced by Wako Pure Chemical Industries, Ltd.), instead of (B-1) in Example 1. A pH of the obtained cleaning agent was 6.5. The relevant cleaning agent was referred to as a cleaning agent 45.

Comparative Example 15

A cleaning agent for a semiconductor substrate for comparison was obtained by performing a similar protocol to that in Example 2, except changing the concentration of (B-2) (produced by Wako Pure Chemical Industries, Ltd.) from 16.2 mg to 15.0 mg in Example 2. A pH of the obtained cleaning agent was 5.7. The relevant cleaning agent was referred to as a cleaning agent 46.

Comparative Example 16

A cleaning agent for a semiconductor substrate for comparison was obtained by performing a similar protocol to that in Example 2, except changing the concentration of (B-2) (produced by Wako Pure Chemical Industries, Ltd.) from 16.2 mg to 19.4 mg in Example 2. A pH of the obtained cleaning agent was 7.3. The relevant cleaning agent was referred to as a cleaning agent 47.

Comparative Example 17

A cleaning agent for a semiconductor substrate for comparison was obtained by performing a similar protocol to that in Example 4, except changing the concentration of (B-4) (produced by Wake Pure Chemical Industries, Ltd.) from 34.1 mg to 29.3 mg in Example 4. A pH of the obtained cleaning agent was 5.8. The relevant cleaning agent was referred to as a cleaning agent 48.

Comparative Example 18

A cleaning agent for a semiconductor substrate for comparison was obtained by performing a similar protocol to that in Example 4, except changing the concentration of (B-4) (produced by Wako Pure Chemical Industries, Ltd.) from 34.1 mg to 40.9 mg in Example 4. A pH of the obtained cleaning agent was 7.2. The relevant cleaning agent was referred to as a cleaning agent 49.

Comparative Example 19

A cleaning agent for a semiconductor substrate for comparison was obtained by performing a similar protocol to that in Example 2, except changing the concentration of (B-2) (produced by Wako Pure Chemical Industries, Ltd.) from 16.2 mg to 16.5 mg, and adding 2.5 mg of citric acid (produced by Wako Pure Chemical Industries, Ltd.), in Example 2. A pH of the obtained cleaning agent was 5.4. The relevant cleaning agent was referred to as a cleaning agent 50.

Comparative Example 20

A cleaning agent for a semiconductor substrate for comparison was obtained by performing a similar protocol to that in Example 2, except changing the concentration of (B-2) (produced by Wako Pure Chemical Industries, Ltd.) from 16.2 mg to 16.5 mg, and adding 5.4 mg of tetramethylammonium hydroxide (abbreviated name: TMAH, produced by Wako Pure Chemical Industries, Ltd.), in Example 2. A pH of the obtained cleaning agent was 7.5. The relevant cleaning agent was referred to as a cleaning agent 51.

Compositions (components and % by weight) of the cleaning agents of Examples 1 to 31 are shown in Table 1, and compositions (components and % by weight) of the cleaning agents of Comparative Examples 1 to 20 are shown in Table 2.

TABLE 1

| Example No. | Cleaning agent No. | (A) Chelating agent Abbreviation | (A) Chelating agent Component | (A) Chelating agent Content (%) | (B) Organic amine Abbreviation | (B) Organic amine Component | (B) Organic amine Content (%) | Other component Component | Other component Content (%) | pH |
|---|---|---|---|---|---|---|---|---|---|---|
| Example 1 | Cleaning agent 1 | A-1 | HEDPO | 0.040 | B-1 | ethylamine | 0.020 | None | — | 5.6 |
| Example 2 | Cleaning agent 2 | A-1 | HEDPO | 0.040 | B-2 | ethanolamine | 0.027 | None | — | 5.6 |
| Example 3 | Cleaning agent 3 | A-1 | HEDPO | 0.040 | B-3 | diethanolamine | 0.046 | None | — | 5.6 |
| Example 4 | Cleaning agent 4 | A-1 | HEDPO | 0.040 | B-4 | Tris | 0.057 | None | — | 5.6 |
| Example 5 | Cleaning agent 5 | A-1 | HEDPO | 0.040 | B-5 | AMPDO | 0.046 | None | — | 6.5 |
| Example 6 | Cleaning agent 6 | A-1 | HEDPO | 0.040 | B-7 | 2-APDO | 0.042 | None | — | 6.5 |
| Example 7 | Cleaning agent 7 | A-1 | HEDPO | 0.040 | B-8 | 3-APDO | 0.041 | None | — | 6.5 |
| Example 8 | Cleaning agent 8 | A-1 | HEDPO | 0.040 | B-9 | MAPDO | 0.046 | None | — | 6.6 |
| Example 9 | Cleaning agent 9 | A-2 | EDTPO | 0.059 | B-1 | ethylamine | 0.022 | None | — | 6.6 |
| Example 10 | Cleaning agent 10 | A-2 | EDTPO | 0.080 | B-2 | ethanolamine | 0.030 | None | — | 6.5 |
| Example 11 | Cleaning agent 11 | A-2 | EDTPO | 0.058 | B-3 | diethanolamine | 0.051 | None | — | 6.5 |
| Example 12 | Cleaning agent 12 | A-2 | EDTPO | 0.058 | B-4 | Tris | 0.085 | None | — | 6.5 |
| Example 13 | Cleaning agent 13 | A-2 | EDTPO | 0.059 | B-5 | AMPDO | 0.051 | None | — | 6.8 |
| Example 14 | Cleaning agent 14 | A-2 | EDTPO | 0.058 | B-6 | AEPDO | 0.058 | None | — | 6.6 |
| Example 15 | Cleaning agent 15 | A-2 | EDTPO | 0.059 | B-7 | 2-APDO | 0.050 | None | — | 6.8 |
| Example 16 | Cleaning agent 16 | A-2 | EDTPO | 0.080 | B-8 | 3-APDO | 0.045 | None | — | 6.7 |
| Example 17 | Cleaning agent 17 | A-2 | EDTPO | 0.059 | B-9 | MAPDO | 0.057 | None | — | 6.7 |
| Example 18 | Cleaning agent 18 | A-3 | NTPO | 0.084 | B-2 | ethanolamine | 0.064 | None | — | 6.7 |
| Example 19 | Cleaning agent 19 | A-3 | NTPO | 0.084 | B-4 | Tris | 0.127 | None | — | 6.7 |
| Example 20 | Cleaning agent 20 | A-3 | NTPO | 0.084 | B-6 | AMPDO | 0.107 | None | — | 5.6 |
| Example 21 | Cleaning agent 21 | A-3 | NTPO | 0.084 | B-7 | 2-APDO | 0.097 | None | — | 5.6 |
| Example 22 | Cleaning agent 22 | A-3 | NTPO | 0.084 | B-8 | 3-APDO | 0.091 | None | — | 5.6 |
| Example 23 | Cleaning agent 23 | A-4 | DEPPO | 0.111 | B-4 | Tris | 0.178 | None | — | 5.6 |
| Example 24 | Cleaning agent 24 | A-4 | DEPPO | 0.111 | B-7 | 2-APDO | 0.140 | None | — | 6.6 |
| Example 25 | Cleaning agent 25 | A-4 | DEPPO | 0.111 | B-8 | 3-APDO | 0.133 | None | — | 6.6 |
| Example 26 | Cleaning agent 26 | A-1 | HEDPO | 0.040 | B-4 | Tris | 0.057 | DBSA | 0.005 | 6.8 |
| Example 27 | Cleaning agent 27 | A-1 | HEDPO | 0.040 | B-4 | Tris | 0.057 | DBS | 0.005 | 6.8 |
| Example 28 | Cleaning agent 28 | A-1 | HEDPO | 0.040 | B-4 | Tris | 0.057 | DBSA | 0.005 | 6.8 |
| Example 29 | Cleaning agent 29 | A-1 | HEDPO | 0.040 | B-4 | Tris | 0.057 | SOS | 0.005 | 6.8 |
| Example 30 | Cleaning agent 30 | A-1 | HEDPO | 0.040 | B-4 | Tris | 0.057 | EMAL AD-25R | 0.005 | 6.8 |

TABLE 1-continued

| Example No. | Cleaning agent No. | (A) Chelating agent Abbreviation | Component | Content (%) | (B) Organic amine Abbreviation | Component | Content (%) | Other component Component | Content (%) | pH |
|---|---|---|---|---|---|---|---|---|---|---|
| Example 31 | Cleaning agent 31 | A-1 | HEDPO | 0.040 | B-4 | Tris | 0.057 | PELEX OFF | 0.055 | 6.8 |

HEDPO: 1-hydroxyethylomine, 1'-diphosphonic acid
EDTPO: ethylenediamine tetra(methylenephosphonic acid)
NTPO: nitrilotris(methylenephosphonic acid)
DEPPO: diethylenetriamine penta(methylenephosphonic acid)
Tris: 2-amino-2hydroxymethyl-1,3-propanediol
AMPDO: 2-amino-1 methyl-1,3-propanediol
AEPDO: 2-amino-2-ethyl-1,3-propanediol
2-APDO: 2-amino-1,3-propanediol
3-APDO: 3-amino-1,2-propanediol
MAPDO: 3-methylamine-1, 2-propanediol
DBSA: dodecylbenzene sulfonic acid
DBS: sodium dodecylbenzene sulfonate
DBSN: ammonium dodecylbenzene sulfonate
SDS: sodium lauryl sulfate

TABLE 2

| Comparative Example No. | Cleaning agent No. | (A) Chelating agent Abbreviation | Component | Content (%) | (B) Organic amine Abbreviation | Component | Content (%) | Other component Component | Content (%) | pH |
|---|---|---|---|---|---|---|---|---|---|---|
| Comparative Example 1 | Cleaning agent 32 | — | None | — | B-1 | ethalyamine | 0.020 | None | — | 11.1 |
| Comparative Example 2 | Cleaning agent 33 | — | None | — | B-10 | diethalymine | 0.532 | None | — | 11.3 |
| Comparative Example 3 | Cleaning agent 34 | — | None | — | B-2 | ethanolamine | 0.027 | None | — | 10.5 |
| Comparative Example 4 | Cleaning agent 35 | — | None | — | B-3 | diethanolamine | 0.046 | None | — | 10.1 |
| Comparative Example 5 | Cleaning agent 36 | — | None | — | B-4 | Tris | 0.057 | None | — | 0.4 |
| Comparative Example 6 | Cleaning agent 37 | A-1 | HEDPO | 0.040 | — | None | — | None | — | 2.5 |
| Comparative Example 7 | Cleaning agent 38 | A-1 | HEDPO | 0.040 | — | None | — | TMAH | 0.038 | 6.7 |
| Comparative Example 8 | Cleaning agent 39 | A-1 | HEDPO | 0.040 | B-2 | ethanolamine | 0.026 | TMAH citric acid | 0.038 0.027 | 6.7 |
| Comparative Example 9 | Cleaning agent 40 | A-1 | HEDPO | 0.040 | B-2 | ethanolamine | 0.026 | TMAH | 0.009 | 6.7 |
| Comparative Example 10 | Cleaning agent 41 | A-1 | HEDPO | 0.040 | B-4 | Tris | 0.057 | TMAH citirc acid | 0.038 0.029 | 6.7 |
| Comparative Example 11 | Cleaning agent 42 | A-1 | HEDPO | 0.040 | B-4 | Tirs | 0.029 | TMAH | 0.018 | 6.5 |
| Comparative Example 12 | Cleaning agent 43 | A-1 | HEDPO | 0.040 | B-11 | triethylamine | 0.545 | None | — | 6.7 |
| Comparative Example 13 | Cleaning agent 44 | A-1 | HEDPO | 0.040 | B-12 | triethanolamine | 0.070 | None | — | 6.5 |
| Comparative Example 14 | Cleaning agent 45 | A-1 | HEDPO | 0.040 | B-13 | ethylenediamine | 0.015 | None | — | 6.8 |
| Comparative Example 15 | Cleaning agent 46 | A-1 | HEDPO | 0.040 | B-2 | ethanolamine | 0.025 | None | — | 5.7 |
| Comparative Example 16 | Cleaning agent 47 | A-1 | HEDPO | 0.040 | B-2 | ethanolamine | 0.032 | None | — | 7.3 |
| Comparative Example 17 | Cleaning agent 48 | A-1 | HEDPO | 0.040 | B-4 | Tris | 0.549 | None | — | 5.8 |
| Comparative Example 18 | Cleaning agent 49 | A-1 | HEDPO | 0.040 | B-4 | Tris | 0.058 | None | — | 7.2 |
| Comparative Example 19 | Cleaning agent 50 | A-1 | HEDPO | 0.040 | B-2 | ethanolamine | 0.027 | citric acid | 0.004 | 5.4 |
| Comparative Example 20 | Cleaning agent 51 | A-1 | HEDPO | 0.040 | B-2 | ethanolamine | 0.027 | TMAH | 0.008 | 7.5 |

HEDPO: 1-hydroxyethylomine-1,1'diphosphoric acid
Tris: 2-amino-2hydroxymethyl-1,3-propanediol
TMAH: tetramethylammonium hydroxide

Evaluation Example 1: Evaluation of Corrosion Property to Tungsten (W)

Evaluation of corrosion property to tungsten was carried out by dipping a wafer having a tungsten single layer film into the cleaning agent for the semiconductor substrate of the present invention or the cleaning agent for the semiconductor substrate for comparison, and then by quantifying concentration of tungsten eluted from the wafer into the cleaning agent. The lower elution amount of tungsten per unit area was determined to be the lower corrosion property to tungsten.

(1) Pretreatment of a Wafer Having a Tungsten Single Layer Film

A wafer having a tungsten single layer film (the one obtained by vapor deposition of a tungsten metal in a thickness of 400 nm on a silicon substrate, manufactured by Philtech Inc.) was cut to a chip having a length of 2 cm and a width of 2 cm, dipped into an aqueous solution of 1% ammonia for 1 minute, and then washed with ultra pure water.

(2) Elution of Tungsten

Thus pretreated wafer chip having the tungsten single layer film was dipped into 10 mL of each cleaning agent, stirred for 10 minutes, and then taken out of the cleaning agent.

(3) Measurement of Elution Amount of Tungsten 9 mL of the cleaning agent was taken out from 10 mL of each cleaning agent after dipping the wafer chip having the tungsten single layer film, a pH thereof was adjusted to 3.0 using nitric acid, and ultra pure water was added so as to attain a total amount of 10 mL, to obtain a measurement solution Tungsten concentration in the measurement solution was measured using an ICP-OES (Inductively-Coupled Plasma Optical Emission Spectrometer) (SPS3100 model, manufactured by SII Nano Technology Inc.).

(4) Determining Evaluation of Corrosion Property to Tungsten

The tungsten concentration was substituted into the following mathematical formula <1> to calculate a tungsten elution rate (nm/min), and corrosion property to tungsten was determined.

$$\text{Tungsten elution rate (nm/min)} = (400 \cdot Wa)/(Wb \cdot T) \quad \text{Mathematical formula <1>}$$

Notes

Wa: tungsten concentration in the measurement solution, quantified by ICP-OES analysis (ppm, mg/L)

Wb: tungsten concentration in the case where all of the tungsten single layer film is eluted into 10 mL of the solution (ppm, mg/L)

T: elution time (min)

Evaluation Example 2: Evaluation of Removal Property of Polishing Fines (Particle)

Evaluation of removal property of polishing fines (particle) was carried out by measuring a zeta potential of silicon dioxide in the case of using the cleaning agent for the semiconductor substrate of the present invention and the cleaning agent for the semiconductor substrate for comparison, and by comparing a value of the zeta potential. It should be noted that the larger negative value of the zeta potential of the silicon dioxide was determined to be the more superior in removal property of the polishing fines (particle).

(1) Preparation of Silicon Dioxide Dispersion Liquid 0.2 g of silicon dioxide particles (particle size: 70 nm, produced by Wako Pure Chemical Industries, Ltd.) was dispersed into 10 mL of ultra pure water using ultrasonic wave for 10 minutes to obtain a silicon dioxide dispersion liquid.

(2) Measurement of the Zeta Potential of Silicon Dioxide

100 μL of thus prepared silicon dioxide dispersion liquid was added into 10 mL of each cleaning agent to prepare a measurement liquid. It should be noted that the zeta potential of silicon dioxide was measured using a zeta potentiometer (ELSZ-2, manufactured by Otsuka Electronics Co., Ltd.).

Evaluation Example 3: Evaluation of Removal Property of Polishing Fines (Particle) on a Silicon Oxide Film Evaluation of removal property of polishing fines (particle) on a silicon oxide film was carried out by dipping a wafer having a silicon oxide film into a slurry solution consisting of 2% silicon dioxide and 0.1% hydrogen peroxide water, by cleaning with the cleaning agent for the semiconductor substrate of the present invention or the cleaning agent for the semiconductor substrate for comparison, and then by measuring amount of the polishing fines (particle) remaining on the wafer, using a scanning probe microscope (SPM, S-image, manufactured by SII Nano Technology Inc.). It should be noted that the less remaining amount of the polishing fines (particle) per unit area was determined to be the more superior in removal property of the polishing fines (particle) on the silicon oxide film.

(1) Pretreatment of a Wafer Having a Silicon Oxide Film

A wafer having a tungsten single layer film (the one formed with a silicon oxide film in a thickness of 500 nm on a silicon substrate, manufactured by Philtech Inc.) was cut to a chip having a length of 1 cm and a width of 1 cm, dipped into an aqueous solution of 30% hydrogen peroxide water/28% ammonia water/ultra pure water=1/1/5 for 20 minute, and then washed with ultra pure water.

(2) Contamination Treatment of the Silicon Oxide Film

Thus pretreated wafer chip having the silicon oxide film was dipped into the slurry solution consisting of 2% silicon dioxide and 0.1% hydrogen peroxide water, stirred for 30 minutes, and then taken out from the slurry solution.

(3) Cleaning Treatment of the Silicon Oxide Film

Thus contaminated wafer chip having the silicon oxide film was dipped into each cleaning agent for 10 seconds, washed with ultra pure water, and then dried the wafer by blowing nitrogen.

(4) Measurement of the Polishing Fines (Particle) on the Wafer

Thus washed wafer chip having the silicon oxide film was measured in a DFM mode using SPM, in a range of 5 μm square, to obtain the imaging of surface shape. Total area of the polishing fines (particle) within the image was divided with the total area of the range measured to calculate ratio occupied by the polishing fines (particle), and the calculated value was employed as a remaining ratio of the polishing fines.

Example 32

Results of cleaning evaluation by the methods of Evaluation Examples 1 to 3 using the cleaning agent 1, are as follows: 0.036 nm/min of a tungsten elution rate, −56 my of a zeta potential, and 25% of a remaining ratio of polishing fines.

Example 33

Results of cleaning evaluation by the methods of Evaluation Examples 1 to 3 using the cleaning agent 2, are as

Example 34

Results of cleaning evaluation by the methods of Evaluation Examples 1 to 3 using the cleaning agent 3, are as follows: 0.035 nm/min of a tungsten elution rate, −56 mV of a zeta potential, and 21% of a remaining ratio of polishing fines.

Example 35

Results of cleaning evaluation by the methods of Evaluation Examples 1 to 3 using the cleaning agent 4, are as follows: 0.025 nm/min of a tungsten elution rate, −62 mV of a zeta potential, and 11% of a remaining ratio of polishing fines.

Example 36

Results of cleaning evaluation by the methods of Evaluation Examples 1 to 3 using the cleaning agent 5, are as follows: 0.020 nm/min of a tungsten elution rate, −60 mV of a zeta potential, and 15% of a remaining ratio of polishing fines.

Example 37

Results of cleaning evaluation by the methods of Evaluation Examples 1 to 3 using the cleaning agent 6, are as follows: 0.017 nm/min of a tungsten elution rate, −62 my of a zeta potential, and 13% of a remaining ratio of polishing fines.

Example 3

Results of cleaning evaluation by the methods of Evaluation Examples 1 to 3 using the cleaning agent 7, are as follows: 0.023 nm/min of a tungsten elution rate, −60 mV of a zeta potential, and 17% of a remaining ratio of polishing fines.

Example 39

Results of cleaning evaluation by the methods of Evaluation Examples 1 to 3 using the cleaning agent 8, are as follows: 0.018 nm/min of a tungsten elution rate, −58 mV of a zeta potential, and 12% of a remaining ratio of polishing fines.

Example 40

Results of cleaning evaluation by the methods of Evaluation Examples 1 to 3 using the cleaning agent 9, are as follows: 0.027 nm/min of a tungsten elution rate, −57 mV of a zeta potential, and 27% of a remaining ratio of polishing fines.

Example 41

Results of cleaning evaluation by the methods of Evaluation Examples 1 to 3 using the cleaning agent 10, are as follows: 0.028 nm/min of a tungsten elution rate, −57 mV of a zeta potential, and 26% of a remaining ratio of polishing fines.

Example 42

Results of cleaning evaluation by the methods of Evaluation Examples 1 to 3 using the cleaning agent 11, are as follows: 0.024 nm/min of a tungsten elution rate, −57 mV of a zeta potential, and 24% of a remaining ratio of polishing fines.

Example 43

Results of cleaning evaluation by the methods of Evaluation Examples 1 to 3 using the cleaning agent 12, are as follows: 0.017 nm/min of a tungsten elution rate, −65 my of a zeta potential, and 15% of a remaining ratio of polishing fines.

Example 44

Results of cleaning evaluation by the methods of Evaluation Examples 1 to 3 using the cleaning agent 13, are as follows: 0.017 nm/min of a tungsten elution rate, −65 mV of a zeta potential, and 13% of a remaining ratio of polishing fines.

Example 45

Results of cleaning evaluation by the methods of Evaluation Examples 1 to 3 using the cleaning agent 14, are as follows: 0.015 nm/min of a tungsten elution rate, −62 mV of a zeta potential, and 16% of a remaining ratio of polishing fines.

Example 46

Results of cleaning evaluation by the methods of Evaluation Examples 1 to 3 using the cleaning agent 15, are as follows: 0.019 nm/min of a tungsten elution rate, −58 mV of a zeta potential, and 18% of a remaining ratio of polishing fines.

Example 47

Results of cleaning evaluation by the methods of Evaluation Examples 1 to 3 using the cleaning agent 16, are as follows: 0.016 nm/min of a tungsten elution rate, −66 mV of a zeta potential, and 10% of a remaining ratio of polishing fines.

Example 48

Results of cleaning evaluation by the methods of Evaluation Examples 1 to 3 using the cleaning agent 17, are as follows: 0.015 nm/min of a tungsten elution rate, −61 mV of a zeta potential, and 16% of a remaining ratio of polishing fines.

Example 49

Results of cleaning evaluation by the methods of Evaluation Examples 1 to 3 using the cleaning agent 18, are as follows: 0.028 nm/min of a tungsten elution rate, −50 mV of a zeta potential, and 22% of a remaining ratio of polishing fines.

Example 50

Results of cleaning evaluation by the methods of Evaluation Examples 1 to 3 using the cleaning agent 19, are as follows: 0.031 nm/min of a tungsten elution rate, −55 mV of a zeta potential, and 30% of a remaining ratio of polishing fines.

follows: 0.015 nm/min of a tungsten elution rate, −59 mV of a zeta potential, and 10% of a remaining ratio of polishing fines.

Example 51

Results of cleaning evaluation by the methods of Evaluation Examples 1 to 3 using the cleaning agent 20, are as follows: 0.016 nm/min of a tungsten elution rate, −56 mV of a zeta potential, and 16% of a remaining ratio of polishing fines.

Example 52

Results of cleaning evaluation by the methods of Evaluation Examples 1 to 3 using the cleaning agent 21, are as follows: 0.017 nm/min of a tungsten elution rate, −58 mV of a zeta potential, and 17% of a remaining ratio of polishing fines.

Example 53

Results of cleaning evaluation by the methods of Evaluation Examples 1 to 3 using the cleaning agent 22, are as follows: 0.020 nm/min of a tungsten elution rate, −55 mV of a zeta potential, and 7% of a remaining ratio of polishing fines.

Example 54

Results of cleaning evaluation by the methods of Evaluation Examples 1 to 3 using the cleaning agent 23, are as follows: 0.014 nm/min of a tungsten elution rate, −58 mV of a zeta potential, and 11% of a remaining ratio of polishing fines.

Example 55

Results of cleaning evaluation by the methods of Evaluation Examples 1 to 3 using the cleaning agent 24, are as follows: 0.018 nm/min of a tungsten elution rate, −57 my of a zeta potential, and 10% of a remaining ratio of polishing fines.

Example 56

Results of cleaning evaluation by the methods of Evaluation Examples 1 to 3 using the cleaning agent 25, are as follows: 0.018 nm/min of a tungsten elution rate, −58 mV of a zeta potential, and 14% of a remaining ratio of polishing fines.

Example 57

Results of cleaning evaluation by the methods of Evaluation Examples 1 to 3 using the cleaning agent 26, are as follows: 0.012 nm/min of a tungsten elution rate, −61 my of a zeta potential, and 11% of a remaining ratio of polishing fines.

Example 58

Results of cleaning evaluation by the methods of Evaluation Examples 1 to 3 using the cleaning agent 27, are as follows: 0.020 nm/min of a tungsten elution rate, −61 mV of a zeta potential, and 12% of a remaining ratio of polishing fines.

Example 59

Results of cleaning evaluation by the methods of Evaluation Examples 1 to 3 using the cleaning agent 28, are as follows: 0.019 nm/min of a tungsten elution rate, −63 my of a zeta potential, and 15% of a remaining ratio of polishing fines.

Example 60

Results of cleaning evaluation by the methods hods of Evaluation Examples 1 to 3 using the cleaning agent 29, are as follows: 0.020 nm/min of a tungsten elution rate, −64 mV of a zeta potential, and 14% of a remaining ratio of polishing fines.

Example 61

Results of cleaning evaluation by the methods of Evaluation Examples 1 to 3 using the cleaning agent 30, are as follows: 0.018 nm/min of a tungsten elution rate, −61 mV of a zeta potential, and 18% of a remaining ratio of polishing fines.

Example 62

Results of cleaning evaluation by the methods of Evaluation Examples 1 to 3 using the cleaning agent 31, are as follows: 0.020 nm/min of a tungsten elution rate, −64 mV of a zeta potential, and 12% of a remaining ratio of polishing fines.

Comparative Example 21

Results of cleaning evaluation by the methods of Evaluation Examples 1 to 3 using the cleaning agent 32, are as follows: 0.069 nm/min of a tungsten elution rate, −77 mV of a zeta potential, and 2% of a remaining ratio of polishing fines.

Comparative Example 22

Results of cleaning evaluation by the methods of Evaluation Examples 1 to 3 using the cleaning agent 33, are as follows: 0.067 nm/min of a tungsten elution rate, −73 mV of a zeta potential, and 4% of a remaining ratio of polishing fines.

Comparative Example 23

Results of cleaning evaluation by the methods of Evaluation Examples 1 to 3 using the cleaning agent 34, are as follows: 0.051 nm/min of a tungsten elution rate, −70 mV of a zeta potential, and 2% of a remaining ratio of polishing fines.

Comparative Example 24

Results of cleaning evaluation by the methods of Evaluation Examples 1 to 3 using the cleaning agent 35, are as follows: 0.057 nm/min of a tungsten elution rate, −67 mV of a zeta potential, and 5% of a remaining ratio of polishing fines.

Comparative Example 25

Results of cleaning evaluation by the methods of Evaluation Examples 1 to 3 using the cleaning agent 36, are as follows: 0.045 nm/min of a tungsten elution rate, −58 mV of a zeta potential, and 4% of a remaining ratio of polishing fines.

Comparative Example 26

Results of cleaning evaluation by the methods of Evaluation Examples 1 to 3 using the cleaning agent 37, are as follows: 0.009 nm/min of a tungsten elution rate, −41 mV of a zeta potential, and 69% of a remaining ratio of polishing fines.

Comparative Example 27

Results of cleaning evaluation by the methods of Evaluation Examples 1 to 3 using the cleaning agent 38, are as follows: 0.028 nm/min of a tungsten elution rate, −43 mV of a zeta potential, and 60% of a remaining ratio of polishing fines.

Comparative Example 28

Results of cleaning evaluation by the methods of Evaluation Examples 1 to 3 using the cleaning agent 39, are as follows: 0.030 nm/min of a tungsten elution rate, −43 mV of a zeta potential, and 67% of a remaining ratio of polishing fines.

Comparative Example 29

Results of cleaning evaluation by the methods of Evaluation Examples 1 to 3 using the cleaning agent 40, are as follows: 0.029 nm/min of a tungsten elution rate, −47 mV of a zeta potential, and 55% of a remaining ratio of polishing fines.

Comparative Example 30

Results of cleaning evaluation by the methods of Evaluation Examples 1 to 3 using the cleaning agent 41, are as follows: 0.018 nm/min of a tungsten elution rate, −42 my of a zeta potential, and 65% of a remaining ratio of polishing fines.

Comparative Example 31

Results of cleaning evaluation by the methods of Evaluation Examples 1 to 3 using the cleaning agent 42, are as follows: 0.015 nm/min of a tungsten elution rate, −48 mV of a zeta potential, and 51% of a remaining ratio of polishing fines.

Comparative Example 32

Results of cleaning evaluation by the methods of Evaluation Examples 1 to 3 using the cleaning agent 43, are as follows: 0.032 nm/min of a tungsten elution rate, −43 mV of a zeta potential, and 68% of a remaining ratio of polishing fines.

Comparative Example 33

Results of cleaning evaluation by the methods of Evaluation Examples 1 to 3 using the cleaning agent 44, are as follows: 0.021 nm/min of a tungsten elution rate, −42 mV of a zeta potential, and 47% of a remaining ratio of polishing fines.

Comparative Example 34

Results of cleaning evaluation by the methods of Evaluation Examples 1 to 3 using the cleaning agent 45, are as follows: 0.019 nm/min of a tungsten elution rate, −31 mV of a zeta potential, and 66% of a remaining ratio of polishing fines.

Comparative Example 35

Results of cleaning evaluation by the methods of Evaluation Examples 1 to 3 using the cleaning agent 46, are as follows: 0.024 nm/min of a tungsten elution rate, −53 mV of a zeta potential, and 38% of a remaining ratio of polishing fines.

Comparative Example 36

Results of cleaning evaluation by the methods of Evaluation Examples 1 to 3 using the cleaning agent 47, are as follows: 0.039 nm/min of a tungsten elution rate, −66 mV of a zeta potential, and 17% of a remaining ratio of polishing fines.

Comparative Example 37

Results of cleaning evaluation by the methods of Evaluation Examples 1 to 3 using the cleaning agent 48, are as follows: 0.014 nm/min of a tungsten elution rate, −58 mV of a zeta potential, and 37% of a remaining ratio of polishing fines.

Comparative Example 38

Results of cleaning evaluation by the methods of Evaluation Examples 1 to 3 using the cleaning agent 49, are as follows: 0.045 nm/min of a tungsten elution rate, −67 mV of a zeta potential, and 12% of a remaining ratio of polishing fines.

Comparative Example 39

Results of cleaning evaluation by the methods of Evaluation Examples 1 to 3 using the cleaning agent 50, are as follows: 0.020 nm/min of a tungsten elution rate, −51 mV of a zeta potential, and 21% of a remaining ratio of polishing fines.

Comparative Example 40

Results of cleaning evaluation by the methods of Evaluation Examples 1 to 3 using the cleaning agent 51, are as follows: 0.040 nm/min of a tungsten elution rate, −60 mV of a zeta potential, and 18% of a remaining ratio of polishing fines.

Evaluation results of Examples 32 to 62 are shown in Table 3, and evaluation results of Comparative Examples 21 to 40 are shown in Table 4.

TABLE 3

| Example No. | Cleaning agent No. | (A) Chelating agent | (B) Organic amine | Other component component | pH | W Elution rate nm/min | Zeta potential mV | Remaining ratio of polishing lines % |
|---|---|---|---|---|---|---|---|---|
| Example 32 | Cleaning agent 1 | A-1 | B-1 | None | 6.6 | 0.036 | −58 | 29 |
| Example 33 | Cleaning agent 2 | A-1 | B-2 | None | 6.6 | 0.031 | −55 | 30 |
| Example 34 | Cleaning agent 3 | A-1 | B-3 | None | 6.6 | 0.035 | −58 | 21 |
| Example 35 | Cleaning agent 4 | A-1 | B-4 | None | 6.6 | 0.025 | −62 | 11 |
| Example 36 | Cleaning agent 5 | A-1 | B-5 | None | 6.6 | 0.020 | −60 | 15 |
| Example 37 | Cleaning agent 6 | A-1 | B-7 | None | 6.6 | 0.017 | −62 | 13 |
| Example 38 | Cleaning agent 7 | A-1 | B-8 | None | 6.6 | 0.023 | −60 | 17 |
| Example 39 | Cleaning agent 8 | A-1 | B-9 | None | 6.6 | 0.016 | −58 | 12 |
| Example 40 | Cleaning agent 9 | A-2 | B-1 | None | 6.6 | 0.027 | −57 | 27 |
| Example 41 | Cleaning agent 10 | A-2 | B-2 | None | 6.6 | 0.028 | −57 | 26 |
| Example 42 | Cleaning agent 11 | A-2 | B-3 | None | 6.6 | 0.024 | −57 | 24 |
| Example 43 | Cleaning agent 12 | A-2 | B-4 | None | 6.8 | 0.017 | −65 | 15 |
| Example 44 | Cleaning agent 13 | A-2 | B-5 | None | 6.6 | 0.017 | −69 | 13 |
| Example 45 | Cleaning agent 14 | A-2 | B-6 | None | 6.6 | 0.015 | −62 | 16 |
| Example 46 | Cleaning agent 15 | A-2 | B-7 | None | 6.8 | 0.019 | −58 | 18 |
| Example 47 | Cleaning agent 16 | A-2 | B-8 | None | 6.7 | 0.016 | −66 | 10 |
| Example 48 | Cleaning agent 17 | A-2 | B-9 | None | 6.7 | 0.015 | −61 | 16 |
| Example 49 | Cleaning agent 18 | A-3 | B-2 | None | 6.7 | 0.028 | −50 | 22 |
| Example 50 | Cleaning agent 19 | A-3 | B-4 | None | 6.7 | 0.015 | −59 | 10 |
| Example 51 | Cleaning agent 20 | A-3 | B-5 | None | 6.6 | 0.016 | −56 | 16 |
| Example 52 | Cleaning agent 21 | A-3 | B-7 | None | 6.6 | 0.017 | −58 | 17 |
| Example 53 | Cleaning agent 22 | A-3 | B-8 | None | 6.5 | 0.020 | −55 | 7 |
| Example 54 | Cleaning agent 23 | A-4 | B-4 | None | 6.6 | 0.014 | −58 | 11 |
| Example 55 | Cleaning agent 24 | A-4 | B-7 | None | 6.6 | 0.018 | −57 | 10 |
| Example 56 | Cleaning agent 25 | A-4 | B-8 | None | 6.6 | 0.018 | −58 | 14 |
| Example 57 | Cleaning agent 26 | A-1 | B-4 | DBSA | 6.6 | 0.012 | −61 | 11 |
| Example 58 | Cleaning agent 27 | A-1 | B-4 | DBS | 6.8 | 0.020 | −61 | 12 |
| Example 59 | Cleaning agent 28 | A-1 | B-4 | DBSN | 6.8 | 0.019 | −63 | 15 |
| Example 60 | Cleaning agent 29 | A-1 | B-4 | SOS | 6.8 | 0.020 | −64 | 14 |
| Example 61 | Cleaning agent 30 | A-1 | B-4 | EMAL AD-25R | 6.8 | 0.018 | −61 | 18 |
| Example 62 | Cleaning agent 31 | A-1 | B-4 | PELEX OT-P | 6.8 | 0.020 | −64 | 12 |

TABLE 4

| Comparative Example No. | Cleaning agent No. | (A) Chelating agent | (B) Oganic amine | Other component | pH | W Elution rate nm/min | Zeta potential mV | Remaining ratio of polishing lines % |
|---|---|---|---|---|---|---|---|---|
| Comparative Example 21 | Cleaning agent 32 | — | B-1 | None | 11.1 | 0.069 | −77 | 2 |
| Comparative Example 22 | Cleaning agent 33 | — | B-10 | None | 11.3 | 0.067 | −73 | 4 |
| Comparative Example 23 | Cleaning agent 34 | — | B-2 | None | 10.5 | 0.051 | −70 | 2 |
| Comparative Example 24 | Cleaning agent 35 | — | B-3 | None | 10.1 | 0.057 | −67 | 5 |
| Comparative Example 25 | Cleaning agent 36 | — | B-4 | None | 9.4 | 0.045 | −58 | 4 |
| Comparative Example 26 | Cleaning agent 37 | A-1 | — | None | 2.6 | 0.009 | −41 | 69 |
| Comparative Example 27 | Cleaning agent 38 | A-1 | — | TMAH | 6.7 | 0.028 | −43 | 60 |
| Comparative Example 28 | Cleaning agent 39 | A-1 | B-2 | TMAH Citric acid | 6.7 | 0.030 | −43 | 67 |
| Comparative Example 29 | Cleaning agent 40 | A-1 | B-2 | TMAH | 6.7 | 0.029 | −47 | 55 |
| Comparative Example 30 | Cleaning agent 41 | A-1 | B-2 | TMAH Citric acid | 6.7 | 0.018 | −42 | 65 |
| Comparative Example 31 | Cleaning agent 42 | A-1 | B-4 | TMAH | 6.6 | 0.015 | −48 | 51 |
| Comparative Example 32 | Cleaning agent 43 | A-1 | B-11 | None | 6.7 | 0.032 | −43 | 68 |
| Comparative Example 33 | Cleaning agent 44 | A-1 | B-12 | None | 6.5 | 0.021 | −42 | 47 |
| Comparative Example 34 | Cleaning agent 45 | A-1 | B-13 | None | 6.5 | 0.019 | −31 | 66 |
| Comparative Example 35 | Cleaning agent 46 | A-1 | B-2 | None | 5.7 | 0.024 | −53 | 38 |
| Comparative Example 36 | Cleaning agent 47 | A-1 | B-2 | None | 7.3 | 0.039 | −66 | 17 |

TABLE 4-continued

| Comparative Example No. | Cleaning agent No. | (A) Chelating agent | (B) Oganic amine | Other component component | pH | W Elution rate nm/min | Zeta potential mV | Remaining ratio of polishing lines % |
|---|---|---|---|---|---|---|---|---|
| Comparative Example 37 | Cleaning agent 48 | A-1 | B-4 | None | 5.8 | 0.014 | −58 | 37 |
| Comparative Example 38 | Cleaning agent 49 | A-1 | B-4 | None | 7.2 | 0.045 | −67 | 12 |
| Comparative Example 39 | Cleaning agent 50 | A-1 | B-2 | Citric Acid | 5.4 | 0.020 | −51 | 21 |
| Comparative Example 40 | Cleaning agent 51 |  | B-2 | TMAH | 7.5 | 0.040 | −60 | 18 |

As is apparent from the results of Table 3, the cleaning agents for the semiconductor substrate of the present invention (cleaning agents 1 to 31), shown by Examples 32 to 62, were found to have low corrosion property to tungsten, because of having a low elution rate of tungsten of 0.04 nm/min or lower. Further, they were found to be cleaning agents having high removal performance of polishing fines (particle), because of exhibiting a low zeta potential of −55 mV or lower, and still more a low remaining ratio of polishing fines of 30% or less. In addition, as is apparent from the results of Examples 57 to 62, it was found that also cleaning agents further comprising a surfactant has high cleaning performance.

On the other hand, as is apparent from the results of Table 4, the cleaning agents for the semiconductor substrate of Comparative Examples 21 to 25, not comprising the phosphonic acid-based chelating agent, were found to corrode severely a tungsten single layer film, because of exhibiting high value of an elution rate of tungsten of 0.045 nm/min or higher. In addition, Comparative Example 26 not containing an organic amine, and Comparative Example 27 containing a quaternary ammonium hydroxide instead of the organic amine, were found to be cleaning agents having low removal performance of polishing fines (particle), although corrosion properly to tungsten was low. In addition, it was found that it is not desirable that the cleaning agents for the semiconductor substrate of the present invention further comprise the quaternary ammonium hydroxide, because such the cleaning agent exhibited a high zeta potential value, resulting in increased remaining ratio of polishing fines (particle). Still more, any of the case of using a tertiary monoamine (Comparative Examples 32 and 33) or using a primary diamine (Comparative Example 34), instead of a primary or secondary monoamine, were found to provide insufficient removal performance of polishing fines (particle). Still more, the cleaning agents for the semiconductor substrate having a pH of 6 or lower (Comparative Examples 35, 37 and 39) were found to provide insufficient removal performance of polishing fines (particle), and the cleaning agents for the semiconductor substrate having a pH of 7 or higher (Comparative Examples 36, 38 and 40) were found to provide high corrosion property to tungsten.

From the above results, a cleaning agent having, in combination, (A) a phosphonic acid-based chelating agent and (B) a primary or secondary monoamine having at least one alkyl group or hydroxyalkyl group in a molecule, wherein a pH is over 6 and below 7, was found to have sufficient removal performance of polishing fines (particle) remaining on a surface of a silicon oxide film such as a TEOS film, without corroding a tungsten wiring or a tungsten alloy wiring. In addition, the relevant cleaning agent was found to provide easy control of cleaning time in cleaning using the cleaning agent, because of little corrosion of the tungsten wiring or the tungsten alloy wiring, even when cleaning time becomes longer.

INDUSTRIAL APPLICABILITY

The cleaning agent for the semiconductor substrate of the present invention is the one preferable as a cleaning agent for removing polishing fines (particle) such as silica or alumina, remaining on a surface of the semiconductor substrate (wafer), in particular, the surface of a silicon oxide film such as a TEOS film after a CMP process, that is, as the cleaning agent for the semiconductor substrate to be used in a post process of the CMP process of the semiconductor substrate having a tungsten wiring or a tungsten alloy wiring, and the silicon oxide film.

The method for processing the semiconductor substrate surface of the present invention is a preferable one as a treatment method comprising a CMP process and a cleaning process as a post process thereof, in a manufacturing process of a semiconductor substrate; and by treatment of the semiconductor substrate by such the method, the semiconductor substrate or a semiconductor device superior in contact resistance and not having short-circuit between wirings, can be manufactured easily, because of little corrosion of a tungsten wiring or a tungsten alloy wiring.

The invention claimed is:
1. A method for processing a semiconductor substrate surface, comprising:
   a process for treating a surface of a semiconductor substrate having a tungsten wiring or a tungsten alloy wiring, and a silicon oxide film, by chemical mechanical polishing; and
   a process for cleaning the semiconductor substrate after the process by the chemical mechanical polishing, with a cleaning agent for a semiconductor substrate comprising (A) a phosphonic acid-based chelating agent, (B) a primary or secondary monoamine having at least one alkyl group or hydroxyalkyl group in a molecule represented by the general formula [6] or [7],

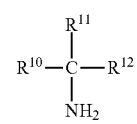

[6]

wherein $R^{10}$ and $R^{11}$ each independently represent a monohydroxyalkyl group having 1 to 3 carbon atoms; and $R^{12}$ represents a hydrogen atom, an alkyl group having 1 to 3 carbon atoms or a monohydroxyalkyl group having 1 to 3 carbon atoms,

[7]

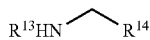

wherein $R^{13}$ represents a hydrogen atom or an alkyl group having 1 to 3 carbon atoms; and $R^{14}$ represents a dihydroxyalkyl group having 1 to 3 carbon atoms, and (C) water, wherein a pH of the cleaning agent is over 6 and below 7.

2. The method according to claim 1, wherein (B) the primary or secondary monoamine having at least one alkyl group or hydroxyalkyl group in a molecule represented by the general formula [6] or [7] is 2-amino-1,3-propanediol, 2-amino-2-methyl-1,3-propanediol, 2-amino-2-hydroxymethyl-1,3-propanediol, 2-amino-2-ethyl-1,3-propanediol, 3-amino-1,2-propanediol or 3-methylamino-1,2-propanediol.

3. The method according to claim 1, wherein the pH is 6.2 to 6.8.

4. The method according to claim 1, wherein (A) the phosphonic acid-based chelating agent is the one represented by the general formula [1], [2] or [3]:

[1]

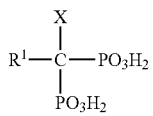

(wherein X represents a hydrogen atom or a hydroxyl group; and $R^1$ represents a hydrogen atom or an alkyl group having 1 to 10 carbon atoms);

[2]

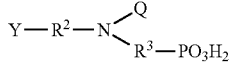

(wherein Q represents a hydrogen atom or $—R^3—PO_3H_2$; $R^2$ and $R^3$ each independently represent an alkylene group; and Y represents a hydrogen atom, $—R^3—PO_3H_2$ or a group represented by the general formula [4]),

[4]

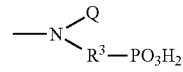

(wherein Q and $R^3$ are the same as described above);

[3]

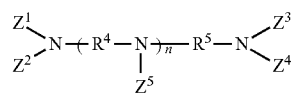

(wherein $R^4$ and $R^5$ each independently represent an alkylene group having 1 to 4 carbon atoms; "n" represents an integer of 1 to 4; and at least 4 groups of $Z^1$ to $Z^4$ and n moieties of $Z^5$ represent an alkyl group having a phosphonic acid group, and remaining groups represent an alkyl group).

5. The method according to claim 1, wherein (A) the phosphonic acid-based chelating agent is 1-hydroxyethylidene-1,1'-diphosphonic acid, nitrilotris(methylenephosphonic acid), ethylenediamine tetra(methylenephosphonic acid) or diethylenetriamine penta(methylenephosphonic acid).

6. The method according to claim 1, wherein the semiconductor substrate is the one having further a silicon nitride film.

7. The method according to claim 1, wherein (B) the primary or secondary monoamine having at least one alkyl group or hydroxyalkyl group in a molecule represented by the general formula [6] or [7] is 2-amino-2-hydroxymethyl-1,3-propanediol.

\* \* \* \* \*